(12) United States Patent
Shue et al.

(10) Patent No.: US 12,374,637 B2
(45) Date of Patent: Jul. 29, 2025

(54) SEMICONDUCTOR PACKAGES AND METHODS FOR FORMING THE SAME

(71) Applicant: TAIWAN SEMICONDUCTOR MANUFACTURING COMPANY, LTD., Hsinchu (TW)

(72) Inventors: Shau-Lin Shue, Hsinchu (TW); Shin-Yi Yang, New Taipei (TW); Ming-Han Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 17/381,561

(22) Filed: Jul. 21, 2021

(65) Prior Publication Data
US 2022/0285292 A1 Sep. 8, 2022

Related U.S. Application Data

(60) Provisional application No. 63/156,233, filed on Mar. 3, 2021.

(51) Int. Cl.
*H01L 23/58* (2006.01)
*H01L 21/66* (2006.01)
*H01L 23/00* (2006.01)
*H01L 23/522* (2006.01)

(52) U.S. Cl.
CPC ............ *H01L 23/585* (2013.01); *H01L 22/10* (2013.01); *H01L 23/5226* (2013.01); *H01L 24/16* (2013.01); *H01L 24/97* (2013.01); *H01L 2224/16225* (2013.01)

(58) Field of Classification Search
CPC ... H01L 23/585; H01L 22/10; H01L 23/5226; H01L 24/16; H01L 24/97
See application file for complete search history.

(56) References Cited

U.S. PATENT DOCUMENTS

| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2004/0248330 | A1* | 12/2004 | Kitabatake ............... H01L 24/40 257/E23.044 |
| 2017/0005035 | A1* | 1/2017 | Chen .................... H01L 23/3171 |

(Continued)

*Primary Examiner* — Kretelia Graham
*Assistant Examiner* — Jaesun Lee
(74) *Attorney, Agent, or Firm* — NZ CARR LAW OFFICE

(57) ABSTRACT

Embodiments of the present disclosure provide an integrated circuit die having edge interconnect features. The edge interconnect features may be conductive lines extending through sealing rings and into scribe line regions. In some embodiments, heterogeneous integrated circuit dies with edge interconnect features are fabricated on the same substrate. Edge interconnect features of the neighboring integrated circuit dies are connected to each other and provide direct connections between the integrated circuit dies without going through an interposer.

20 Claims, 19 Drawing Sheets

(56) References Cited

U.S. PATENT DOCUMENTS

2018/0096952 A1\*  4/2018  Miccoli .................. H01L 23/562
2018/0294230 A1\*  10/2018  Dabral .................... H01L 23/58
2021/0358821 A1\*  11/2021  Chen .................. H01L 25/0657
2022/0199517 A1\*  6/2022  Dabral .................... H01L 24/08
2023/0052432 A1\*  2/2023  Dabral .................... H01L 23/58

\* cited by examiner

SEMICONDUCTOR PACKAGES AND METHODS FOR FORMING THE SAME

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
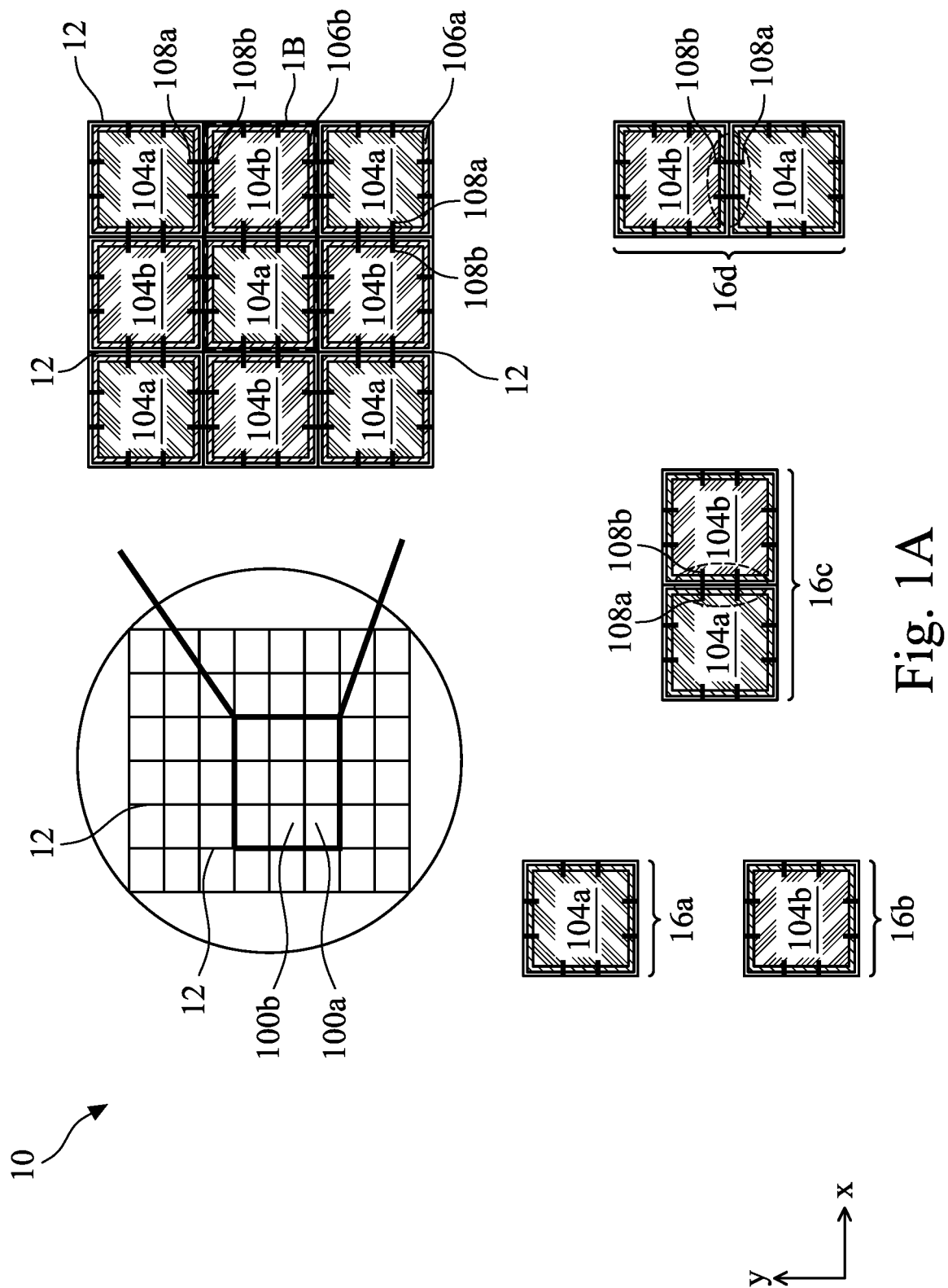
FIGS. 1A-1N schematically demonstrate a semiconductor device including an integrated circuit die having edge interconnect features according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding. For example, by including a solder bonding (instead of, for example, copper to copper bonding), the bonding temperature of the hybrid bonding can be lowered significantly.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

Embodiments of the present disclosure provide an integrated circuit die having edge interconnect features. The edge interconnect features may be conductive lines extending through sealing rings and into scribe line regions. In some embodiments, heterogeneous integrated circuit dies with edge interconnect features are fabricated on the same substrate. Edge interconnect features of the neighboring integrated circuit dies are connected to each other and provide direct connections between the integrated circuit dies without going through an interposer.

Figure 1B:
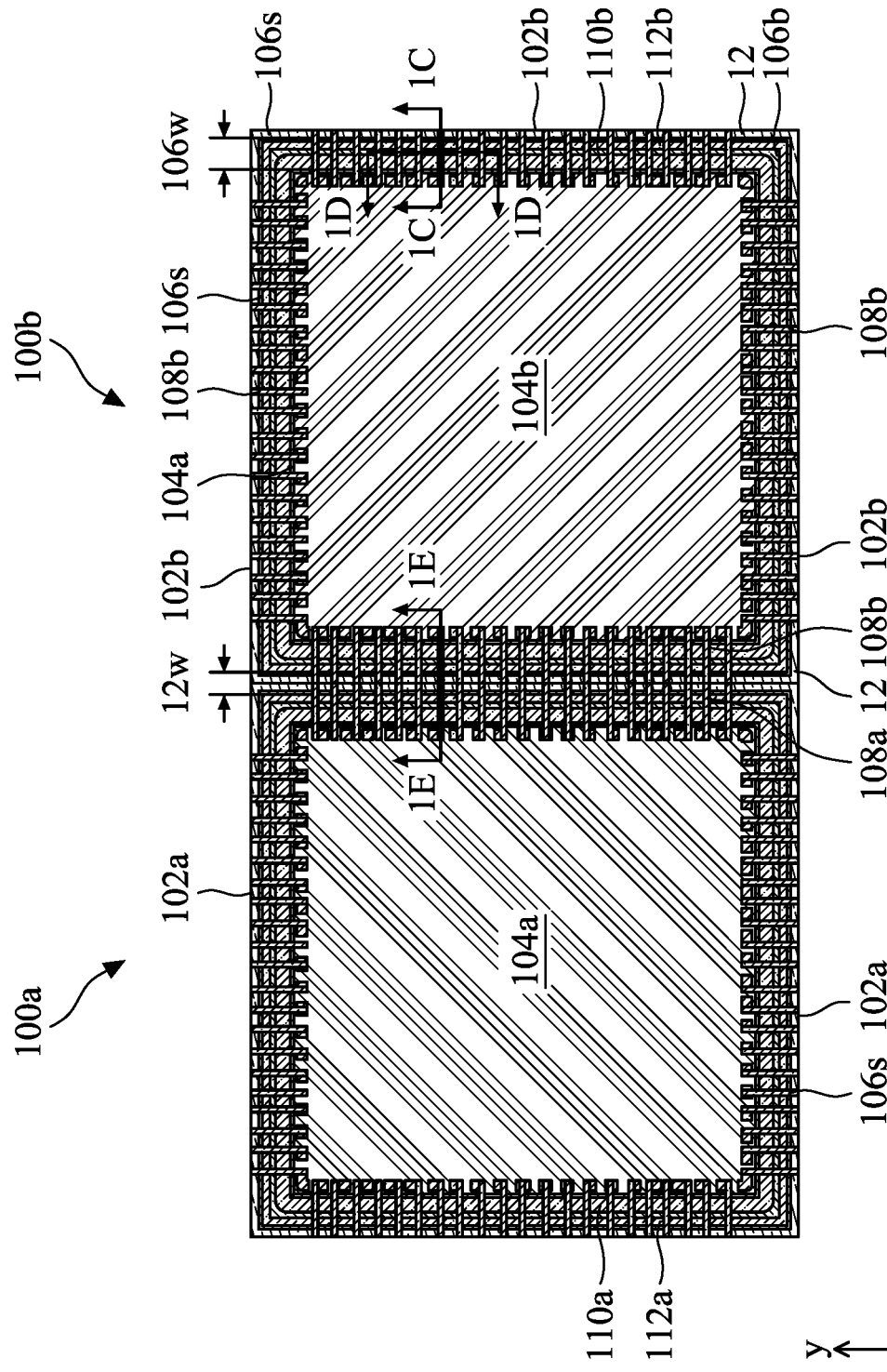
Figure 1C:
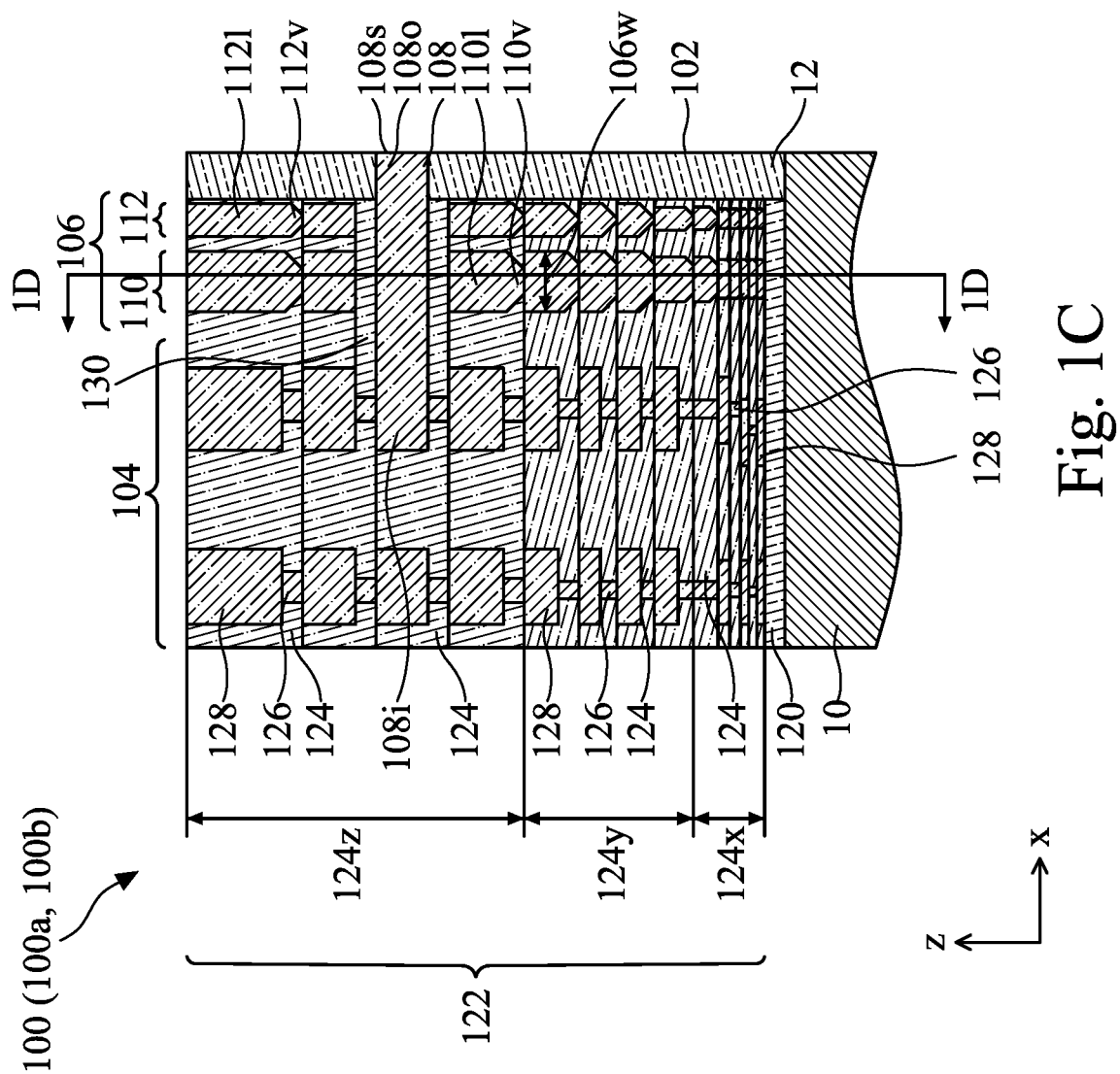
Figure 1D:
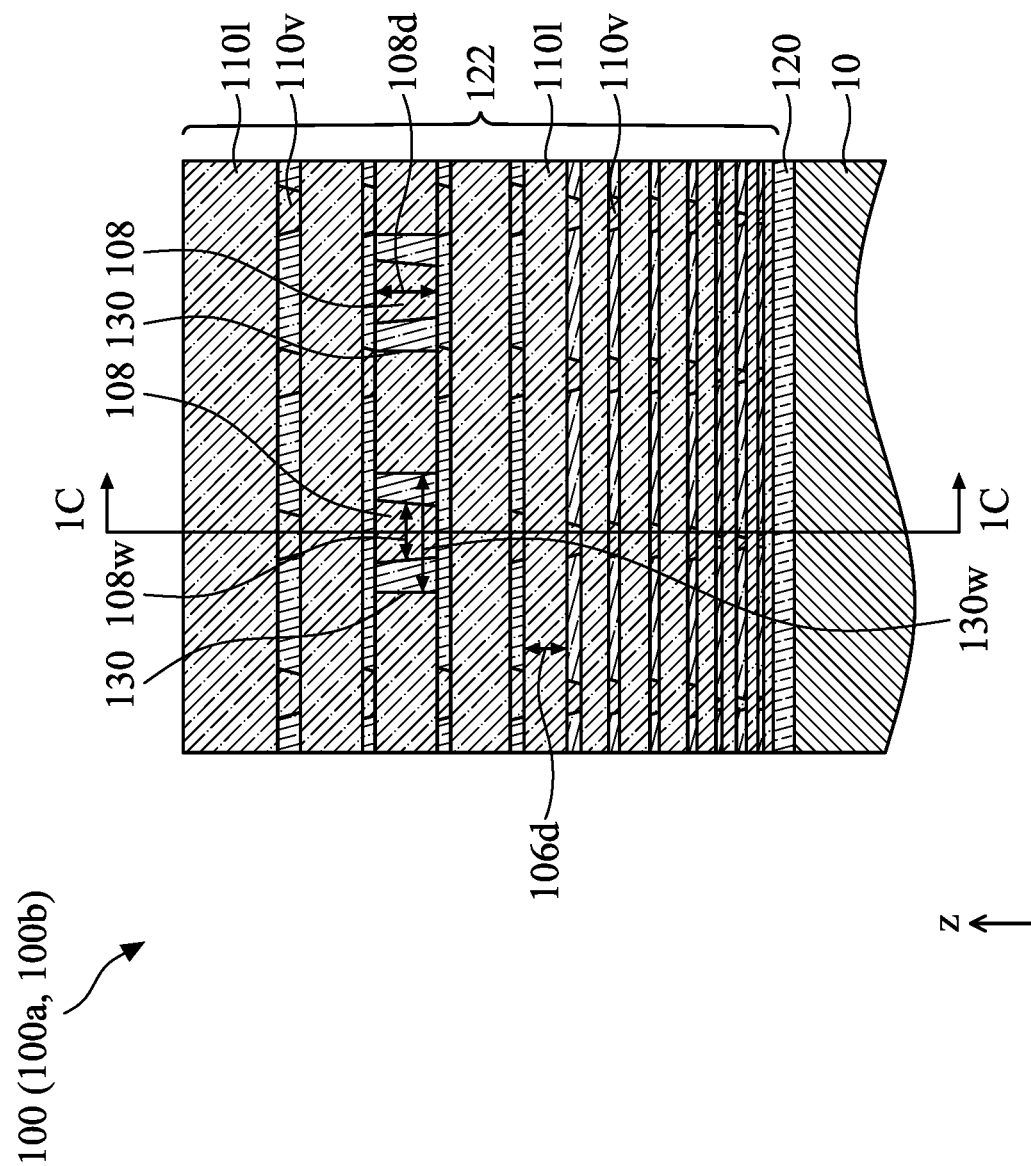
Figure 1E:
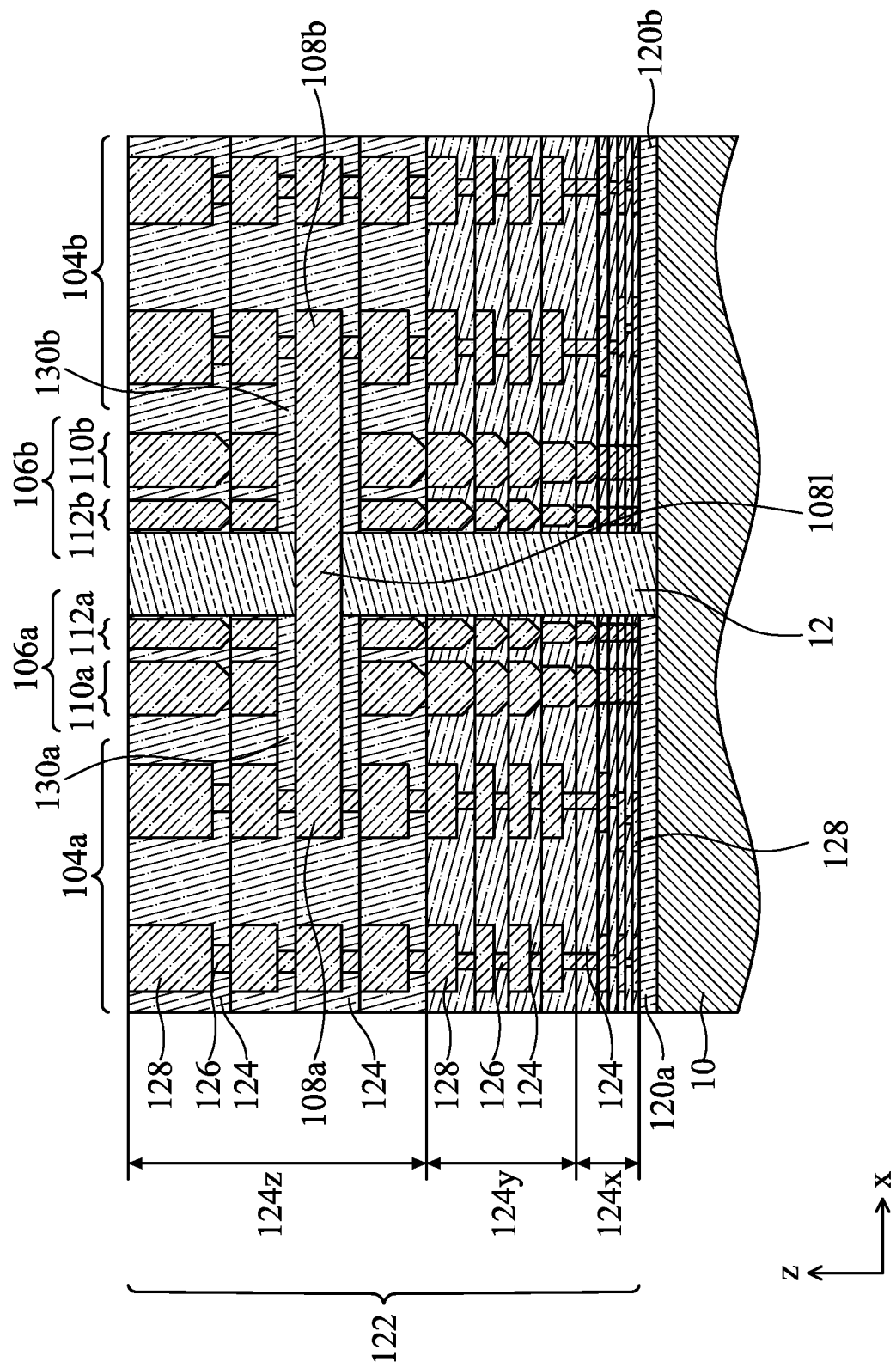
Figure 1F:
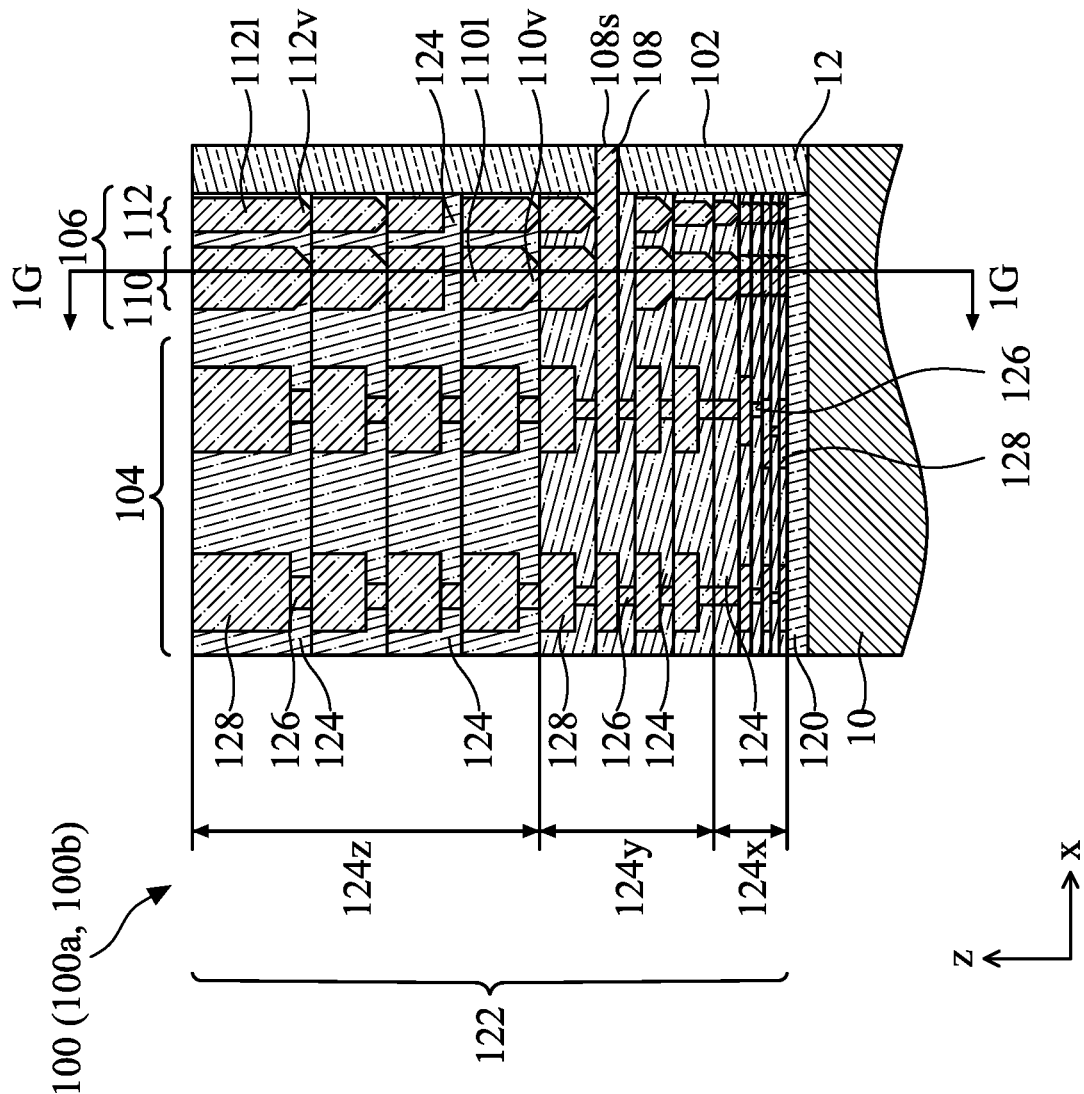
Figure 1G:
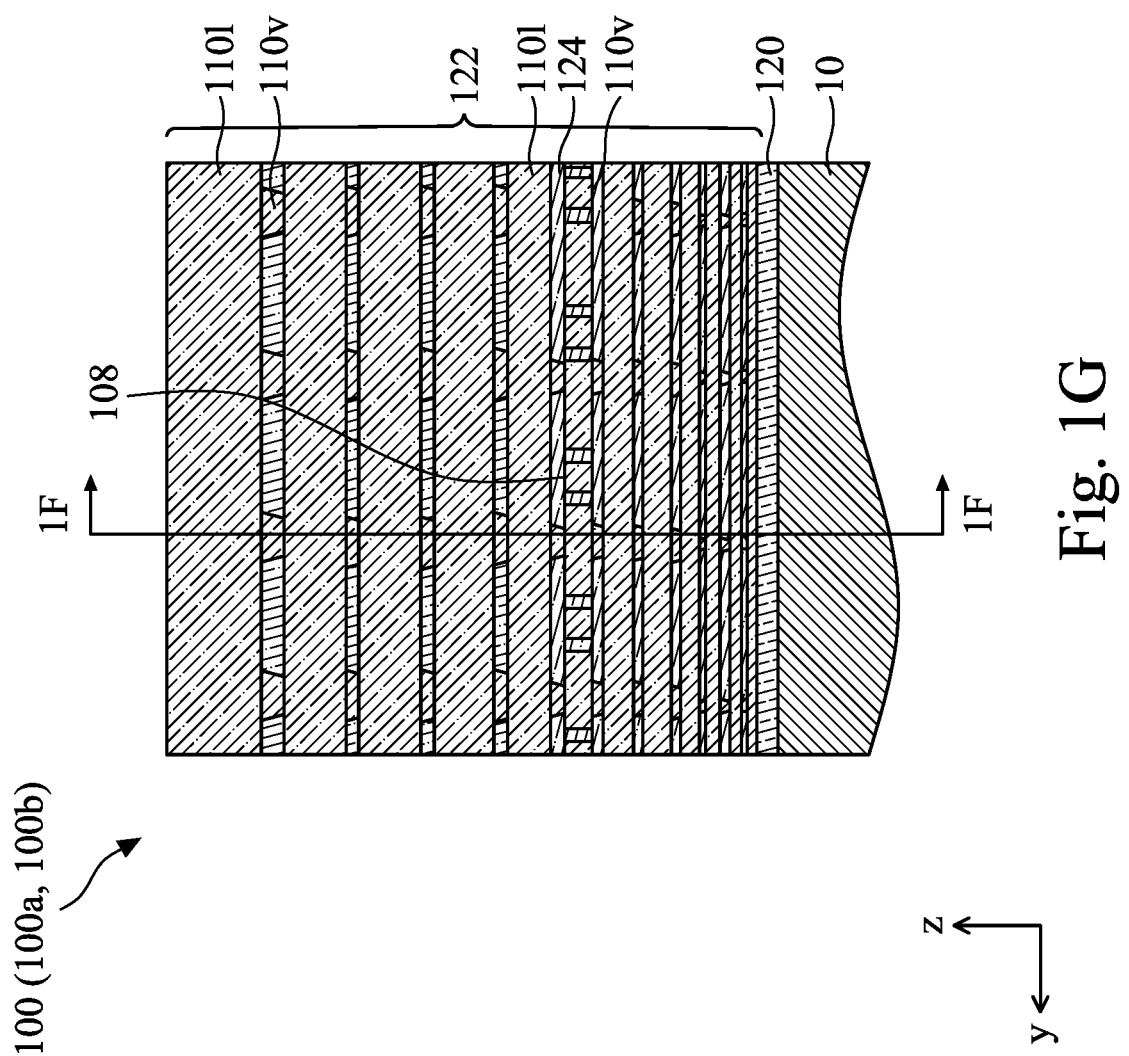
Figure 1H:
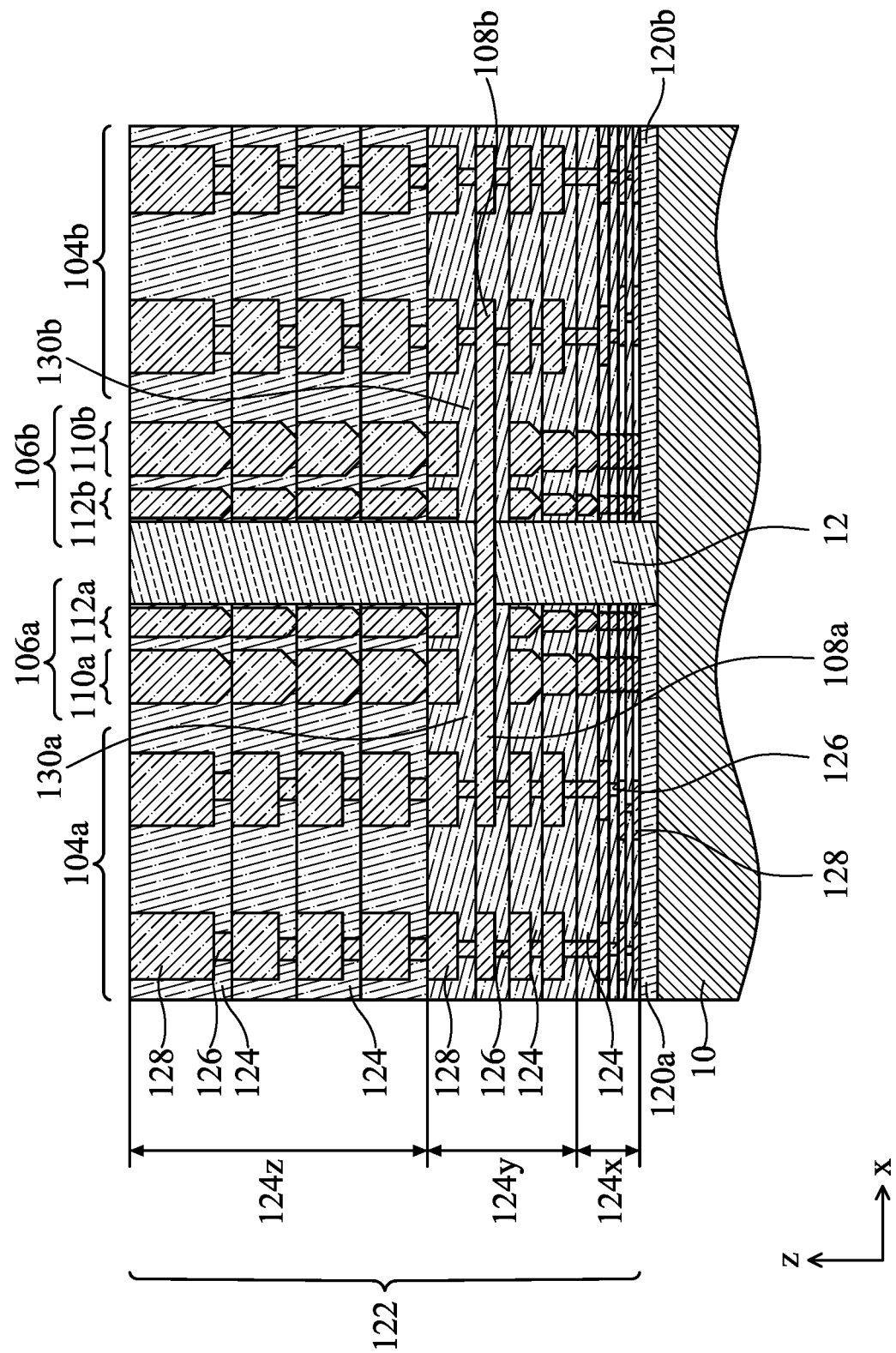
Figure 1I:
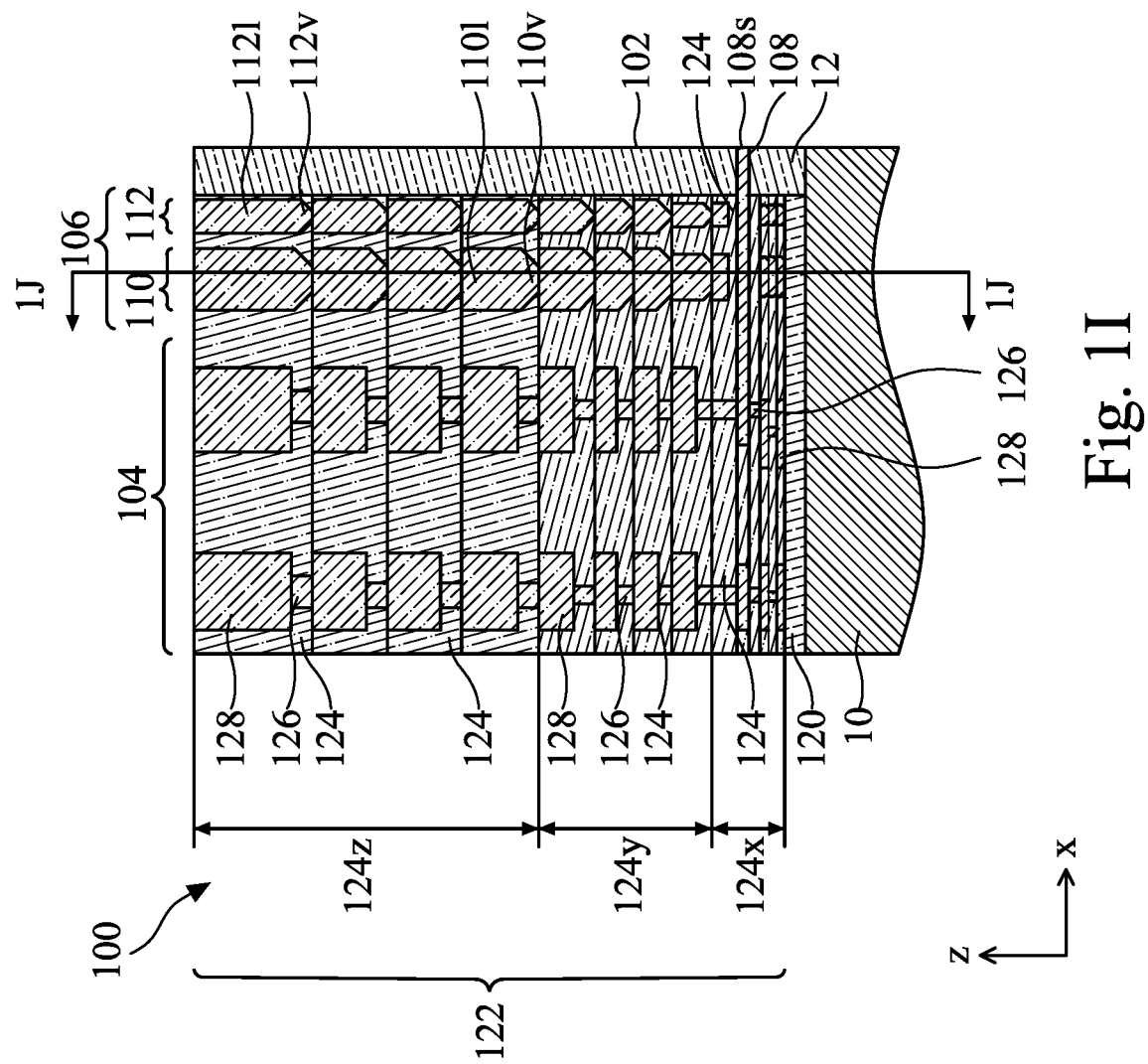
Figure 1J:
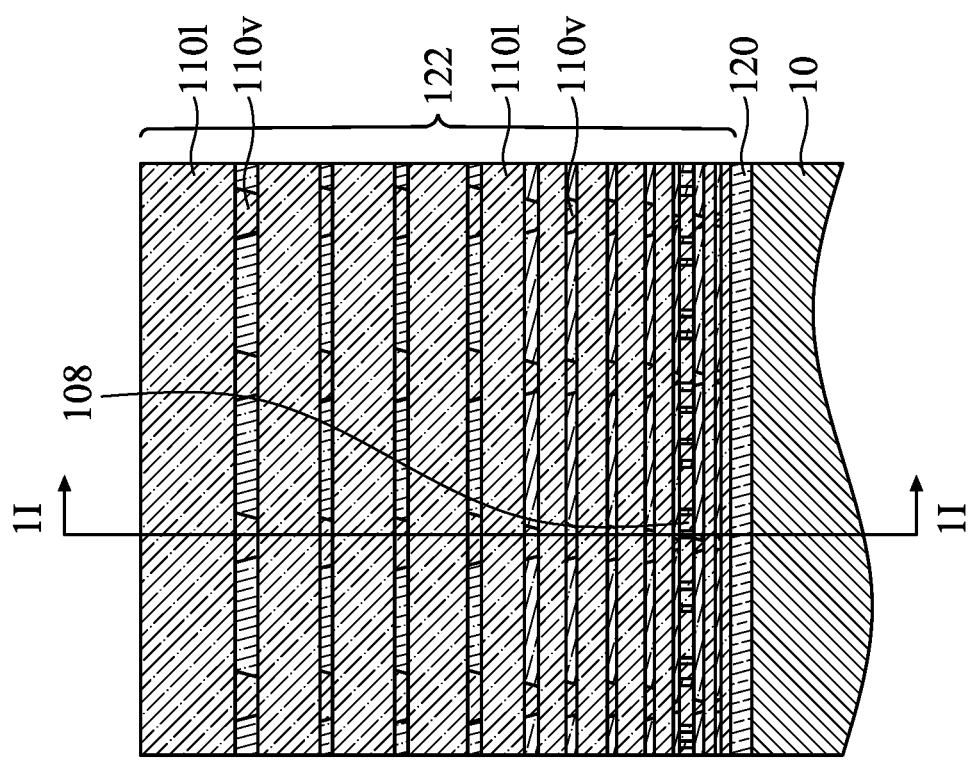
Figure 1K:
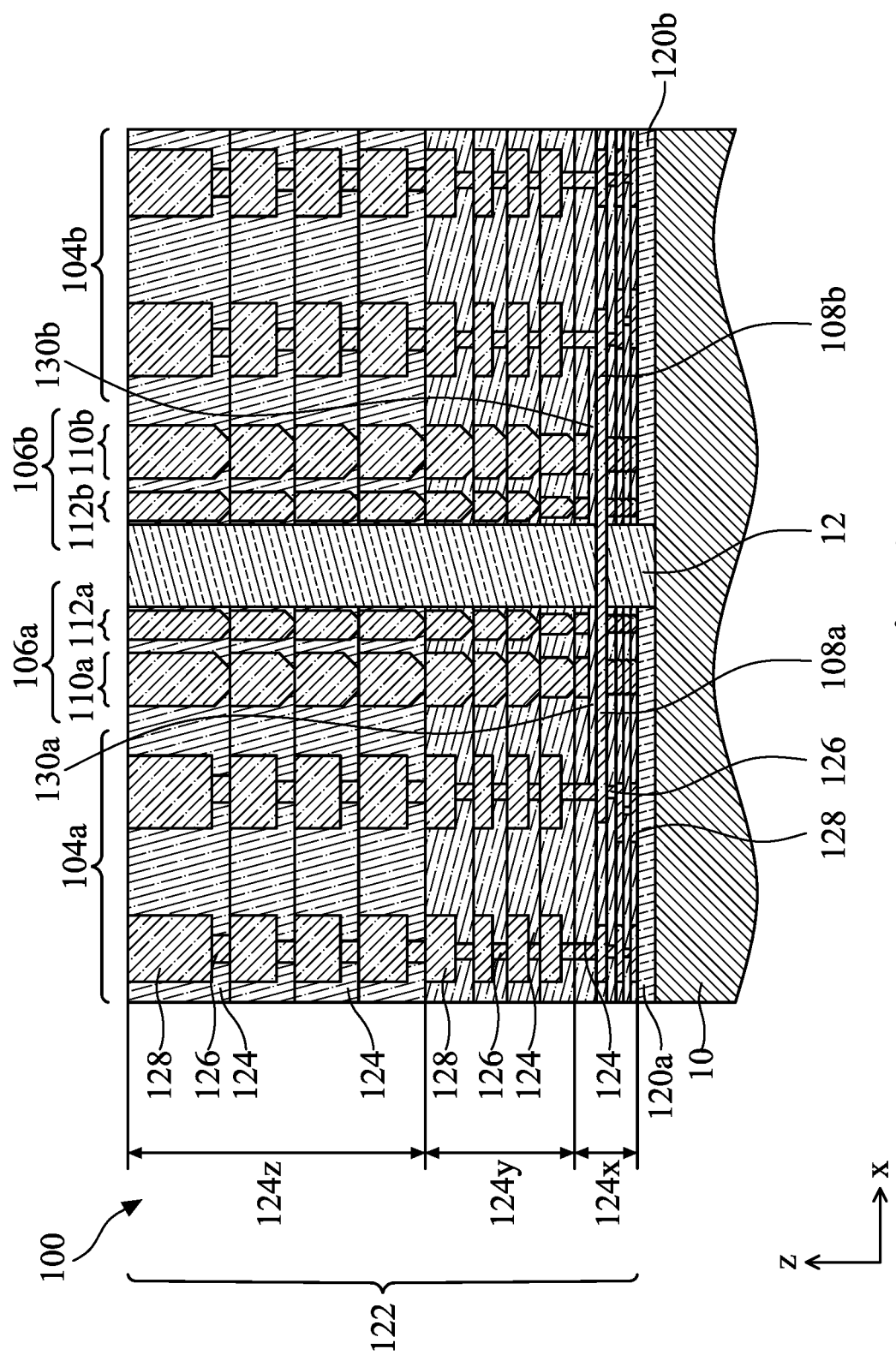
Figure 1L:
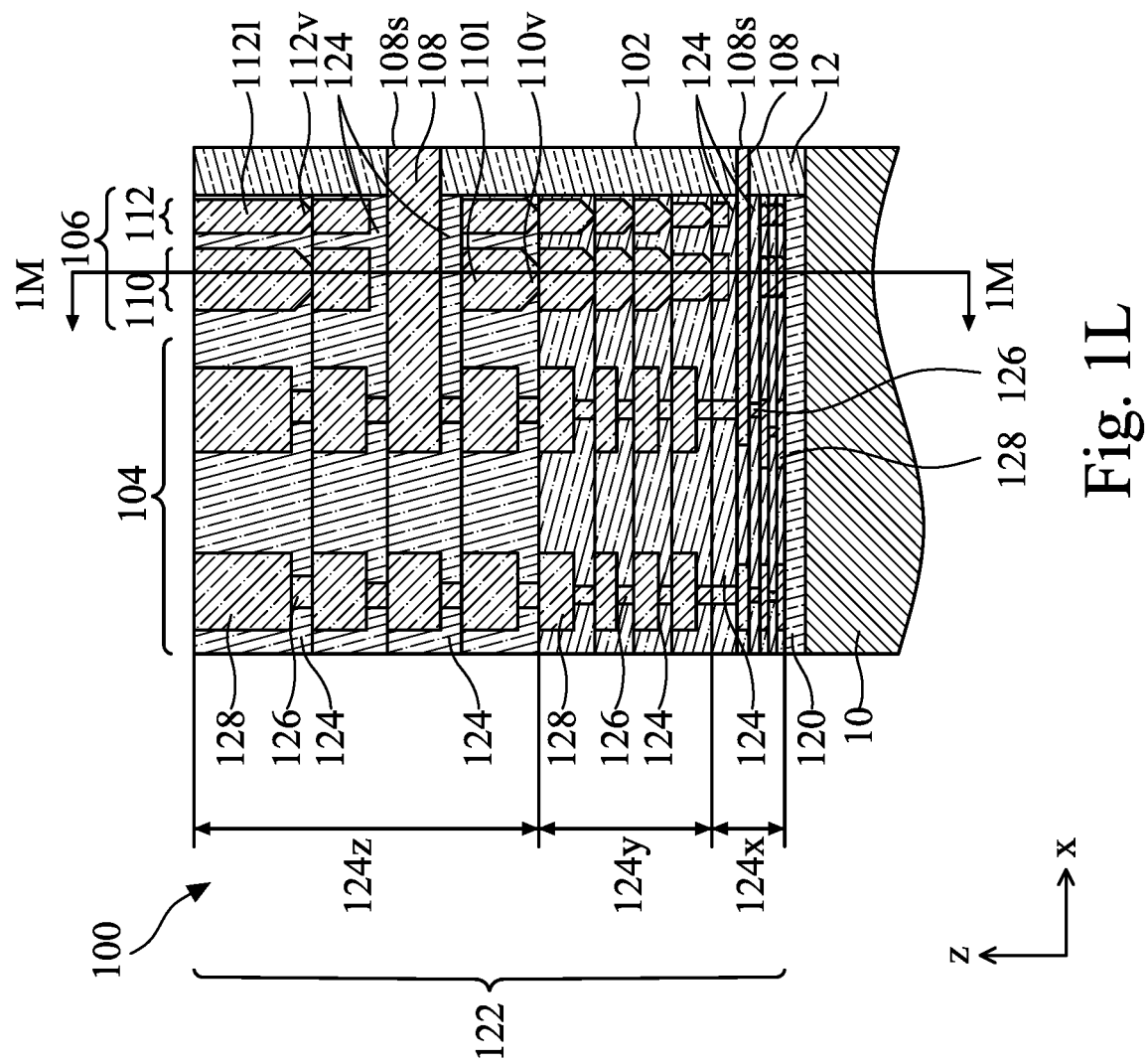
Figure 1M:
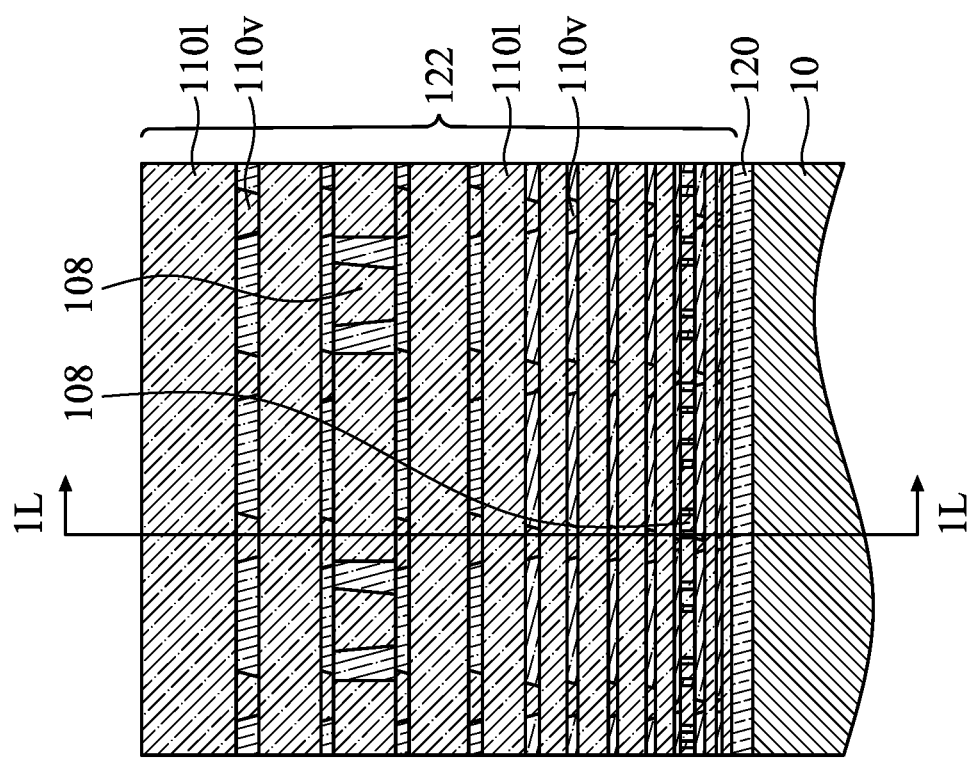
Figure 1N:
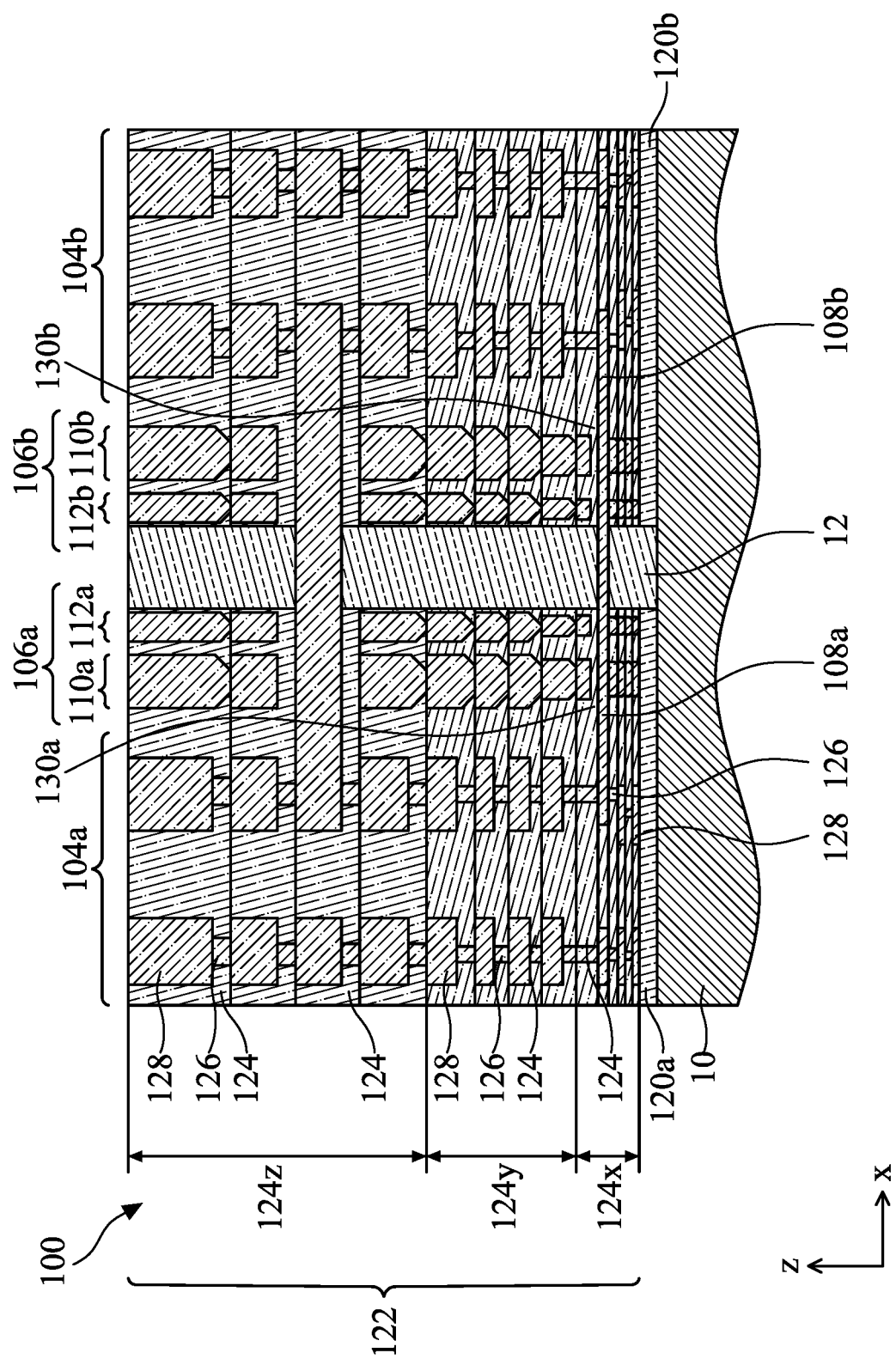

FIGS. 1A-1N schematically demonstrate an integrated circuit die having edge interconnect features according to embodiments of the present disclosure. FIG. 1A is a schematic plan view of a substrate including an array of integrated circuit dies according to the present disclosure. FIG. 1B is a schematic plan view of two neighboring integrated circuit dies 100 (100a, 100b) according to the present disclosure. FIG. 1C is an enlarged partial sectional view of the integrated circuit die 100 along the line 1C-1C in FIG. 1B. FIG. 1D is an enlarged partial sectional view of the integrated circuit die 100 along the line 1D-1D in FIG. 1C. FIG. 1E is an enlarged partial sectional view of the neighboring integrated circuit die 100a, 100b along the line 1E-1E in FIG. 1B.

As shown in FIG. 1A, an array of integrated circuit dies (or chiplets) 100 are formed on a substrate 10. The array of integrated circuit dies 100 are separated from each other by two sets of intersecting scribe lines 12. One set of scribe lines 12 extend along the x-direction and a second set of scribe lines 12 extend along the y-direction. The array of integrated circuit dies 100 are formed in and/or on the substrate 10 within an array of areas defined by the scribe lines 12. In some embodiments, the integrated circuit dies 100 including two or more different circuit designs. After fabrication, the integrated circuit dies 100, may be tested and cut out along the scribe lines 12 to individual integrated circuit dies 100 or various combination of neighboring integrated circuit dies 100 for subsequent processing, such as packaging.

As shown in FIG. 1A, the plurality of integrated circuit dies 100 fabricated in and/or on the substrate 10 include two types of integrated circuit dies 100a, 100b. The integrated circuit dies 100a, 100b may have substantially the same dimension but with different circuit designs to achieve different functions. In some embodiments, the integrated circuit dies 100a, 100b are arranged alternatively so that each of the integrated circuit die 100a is bordered by at least one integrated circuit die 100b. Neighboring integrated circuit dies 100a, 100b are connected through edge interconnect features as discussed below.

As shown in FIG. 1A, each of the integrated circuit die 100 (100a, 100b) may include a circuit region 104 (104a, 104b) surrounded by a seal region 106 (106a, 106b). According to embodiments of the present disclosure, the integrated circuit die 100 (100a, 100b) includes one or more edge interconnect features 108 (108a, 108b) extending from the circuit region 104 (104a, 104b) through the seal region 106 (106a, 106b) into the scribe line 12. In some embodiments, the edge interconnect features 108 may be conductive lines intersecting with the scribe lines 12 surrounding the integrated circuit die 100 (100a, 100b). After the integrated circuit die 100 (100a, 100b) is cut out along the scribe lines 12, the edge interconnect features 108 (108a, 108b) are exposed on cutting surfaces 102 of the integrated circuit die 100 (100a, 100b). The edge interconnect features 108 (108a, 108b) may be conductive lines configured to connect with external contacts formed on the cutting surfaces 102 (102a, 102b) to provide signal and/or power supplies.

In some embodiments, the edge interconnect features 108 (108a, 108b) may be symmetrically arranged across all scribe lines 12 around the integrated circuit die 100 (100a, 100b). The symmetrical arrangement provides high feasibility for circuit designers. One connection protocol for the edge interconnect features may be used in different integrated circuit dies, thus, facilitating fabrication of two or more directly connected integrated circuit dies on one substrate. For example, in FIG. 1A, a plurality of pairs of directly connected integrated circuit dies 100a, 100b are fabricated in and on the substrate 10. In some embodiments, individual integrated circuit dies 100a, 100b may be tested before cutting. The integrated circuit dies 100a, 100b may be cut into various die combinations, such as die combinations 16a, 16b, 16c, 16d, for packaging, thus lowering cost of production. For the die combinations 16a, 16b, which include single integrated circuit dies 100a, 100b, conductive features may be formed from the exposed edge interconnect features 108 to connect with other integrated circuit dies without going through an interposer. The die combinations 16c, 16d, which includes the integrated circuit dies 100a, 100b of different arrangements, may be directly packaged as connected components without cutting out as individual dies.

The substrate 10 may be a semiconductor substrate, for example, bulk silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as a multi-layered or gradient substrate may also be used.

The array of integrated circuit dies 100 may be formed in and/or on the substrate 10 by performing various semiconductor fabrication processes, including, but not limited to, front-end-of-line (FEOL) processing, and back-end-of-line (BEOL) processing. As shown in FIGS. 1C, 1D, and 1E, the various semiconductor fabrication processes are performed to form a device layer 120 (120a, 120b) and an interconnect structure 122 (122a, 122b) in the integrated circuit dies 100 (100a, 100b).

In some embodiments, the array of integrated circuit dies 100 may include two or more different circuit designs formed on the same substrate 10 to achieve direct heterogenous connections between the integrated circuit dies 100. In other embodiments, the array of integrated circuit dies 100 have substantially identical circuit designs, which may be cut off individually to be connected to other circuit components through the edge interconnect features 108.

The integrated circuit dies 100 may be designed to perform any suitable function. For example, the integrated circuit die 100 may be a logic die (e.g., central processing unit, a SoC, ASIC, FPGA, microcontroller, etc.), a memory die (e.g., a DRAM die, a Wide I/O die, a M-RAM die, a R-RAM die, a NAND die, an SRAM die, etc.), a memory cube (e.g., HBM, HMC, etc.), a high data rate transceiver die, an I/O interface die, an integrated passive device die (e.g., an IPD die), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, the like, or a combination thereof.

FIG. 1B is a schematic plan view of two neighboring integrated circuit dies 100a, 100b according to the present disclosure formed on the substrate 10. In FIG. 1B, components formed in various layers along the z-axis are superimposed on one another to show their relative positions in plan view. Positions of the components along the z-axis are shown corresponding cross-sectional views, such as the views in FIGS. 1C and 1D. FIG. 1B illustrates relative positions of the circuit region 104, the seal region 106, and the edge interconnect features 108 within the integrated circuit dies 100 according to some embodiments. As shown in FIG. 1B, each integrated circuit die 100 is defined in a square area by the scribe lines 12. In some embodiments, the integrated circuit dies 100 may have a plan view area in a range between about 10 mm$^2$ and about 1000 mm$^2$ depending on the circuit design and/or function of the integrated circuit die 100. FIG. 1B illustrates integrated circuit dies with a square shape in the plan view. However, the integrated circuit dies may have other shapes in the plan view. For example, rectangular, hexagonal, octagonal shapes may be used to achieve design purposes. Depending on the design, the scribe lines 12 may have a width 12w in a range between about 1 μm to about 200 μm. A scribe line width 12w lower than 1 μm may not be wide enough to tolerant system errors during separation of the integrated circuit dies 100. A scribe line width 12w greater than 200 μm would increase cost of production without additional benefit.

Within the die area of each integrated circuit die 100, the circuit region 104 is surrounded by the seal region 106 around an outer perimeter of the circuit region 104. One or more sealing rings 110, 112 are concentrically formed in the seal region 106. The seal rings 110, 112 provide protection to circuit structures in the circuit region 104 against undesired elements from the exterior environment, such as water vapor, during and after separation of the integrated circuit dies 100.

Even though two sealing rings 110, 112 are shown in the integrated circuit die 100, less or more sealing rings may be included in the seal region 106. After being cut along the scribe lines 12, the portion of the scribe line 12 may remain on sides of the integrated circuit die 100, and the seal region 106 is surrounded by materials of the scribe lines 12 and not exposed on the cutting surfaces 102.

The edge interconnect features 108 are two or more conductive lines extending from the circuit region 104 through the seal region to intersect with the scribe lines 12. In some embodiments, the edge interconnect features 108 may intersect with the corresponding scribe line 12 at a substantially perpendicular manner. In other embodiments, the edge interconnect features 108 may intersect with the corresponding scribe line 12 at a slanted angle. For example, the edge interconnect features 108 may intersect the y-z plan at a slanted angle, such as an angle in a range between about 45 degree to about 90 degree. In some embodiments, the edge interconnect features 108 may be distributed along one or more of sides 106s of the seal region 106. In some embodiments, the edge interconnect features 108 are a plurality of conductive lines distributed along one or more of the sides 106s. In some embodiments, the plurality of conductive lines may be evenly distributed along one or more sides 106s of the seal region 106.

In some embodiments, as shown in FIG. 1B, the edge interconnect features 108 may be symmetrically arranged along all sides 106s of the seal region 106. For example, an equal number of the edge interconnect features 108 are distributed alone every sides 106s of the seal region 106 at a substantially equal pitch. The symmetrical distribution allow corresponding edge interconnect features 108 in neighboring integrated circuit dies 100 to form continuous conductive lines. As shown in FIG. 1B, edge interconnect features 108a of the integrated circuit die 100a are in contact with corresponding edge interconnect features 108b of the integrated circuit die 100a to form a plurality of continuous conductive lines across the shared scribe line 12. Similarly, the edge interconnect features 108a along other sides 106s of the seal region 106 may form continuous line features with corresponding edge interconnect features 108 in the neighboring integrated circuit die 100 along the other sides 106s.

In some embodiments, the edge interconnect features 108a of the integrated circuit die 100a and the corresponding edge interconnect features 108b of the integrated circuit die 100b are fabricated as monolithic conductive lines. The monolithic conductive line arrangement may enable direct communication between devices in the neighboring integrated circuit dies, and thus, allowing the neighboring integrated circuit dies to be packaged together without cutting from the scribe lines. The monolithic conductive line arrangement also provides higher tolerance to the cutting operation and ensures that the edge interconnect features 108 are exposed on the cutting surface 102.

The continuous line features ensure that the edge interconnect features 108 are exposed on the cutting surfaces 102 for subsequent wiring and packaging process after the integrated circuit die 100 is cut free from the substrate 10. The symmetrical arrangement of the edge interconnect features 108 also provide design flexibilities. For example, a common scheme of edge interconnect feature arrangement may be used for different integrated circuit dies, such as for different SoCs, and different memory dies. It should be noted that the edge interconnect features 108 may be arranged in any suitable manner to achieve desired design proposes.

FIGS. 1C and 1D provide additional details of the edge interconnect features 108 within the integrated circuit die 100 according to embodiments of the present disclosure. FIG. 1C schematically illustrates details across the seal region 106 of the integrated circuit die 100. FIG. 1D schematically illustrates details of the integrated circuit die 100 along the sealing ring 110. FIG. 1E schematically illustrates details adjacent the scribe line 12 between the integrated circuit dies 100a, 100b.

As shown in FIGS. 1C and 1D, the device layer 120 is formed in and/or on the substrate 10, and the interconnect structure 122 are formed over the device layer 120. The device layer 120 may include various semiconductor devices, such as transistors, diodes, capacitors, resistors, etc., and may be formed in and/or on the substrate 10. In some embodiments, the device layer 120 includes one or more dielectric layers overlying the semiconductor devices therein.

The interconnection structure 122 includes various conductive features, such as a first plurality of conductive features 126 and second plurality of conductive features 128, and one or more intermetal dielectric (IMD) layers 124 to separate and isolate various neighboring conductive features 126, 128. In some embodiments, the first plurality of conductive features 126 are conductive vias and the second plurality of conductive features 128 are conductive lines. The interconnection structure 122 includes multiple levels of the conductive features 128, and the conductive features 128 are arranged in each level to provide electrical paths to the devices in the device layer 120. The conductive features 126 provide vertical electrical routing from the device layer 120 to the conductive features 128, and between the conductive features 128 in different layers.

The conductive features 126 and conductive features 128 may be made from one or more electrically conductive materials, such as one or more layers of graphene, metal, metal alloy, metal nitride, or silicide. For example, the conductive features 126 and the conductive features 128 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layers 124 may be formed, for example, of a low dielectric constant (low-K) dielectric material, such as SiOx, SiOxCyHz, $SiO_xC_y$, SiCx, SiNx, or related low-k dielectric material, compounds thereof, composites thereof, combinations thereof, or the like. The IMD layers 124 may be formed by any suitable method, such as spinning, chemical vapor deposition (CVD), and/or plasma-enhanced CVD (PECVD). In some embodiments, the interconnect structure 122 may be formed sequentially layer-by-layer from the device layer 120 during BOEL processing. In some embodiments, the interconnect structure 122, the conductive features 126 and conductive features 128 may be fabricated using damascene and/or dual-damascene process.

As shown in FIG. 1C, a plurality of IMD layers 124 are sequentially formed over the device layer 120 with the conductive features 126, 128 having increased dimension. The number of IMD layers 124 may be any number suitable for the circuit design. For example, the number of IMD layers 124 may be between 1 and 30. In FIG. 1C, the IMD layers 124 are divided into three groups: bottom IMD layers 124x, middle IMD layers 124y, top IMD layers 124z based on relative position to the device layer 120. The bottom IMD layers 124x, formed immediately on the device layer 120 are thinner and with the conductive features 126, 128 of a higher density. The middle IMD layers 124y formed over the bottom IMD layers 124x are thicker and with the conductive features 126, 128 of a lower density. The top IMD layers 124z formed over the middle IMD layers 124y are thickest and with the conductive features 126, 128 of a lowest density.

The sealing rings 110, 112 are formed in the seal region 106 between the circuit region 104 and the scribe line 12. Each of the sealing rings 110, 112 includes physically connected components to function as a barrier between the conductive features 126, 128 in the interconnect structure 122 and exterior environment, such as moisture. The sealing rings 110, 112 may be formed by any suitable designs and with any suitable materials, such as materials suitable as moisture barrier. In some embodiments, the sealing rings 110, 112 are formed with electrically conductive materials. In some embodiments, the sealing rings 110, 112 may be electrically grounded. In some embodiments, the sealing rings 110, 112 may be formed from the same material as the conductive features 126, 128. For example, the sealing rings 110, 112 may be formed from Cu, Al, Co, Ru, Mo, W, and related alloys.

FIGS. 1C and 1D schematically demonstrate one example of the sealing rings 110, 112. Other sealing ring structures may be used by persons skilled in the art with the integrated circuit die 100 according to present disclosure. As shown in FIGS. 1C and 1D, each of the sealing rings 110, 112 includes layers of substantially continuous sealing lines 110*l*, 112*l* connected by a plurality of sealing vias 110*v*, 112*v* formed in the IMD layers 124. The continuous sealing lines 110*l*, 112*l* in neighboring IMD layers 124 are connected by the plurality of sealing vias 110*v*, 112*v* respectively. The sealing lines 110*l*, 112*l* and sealing vias 110*v*, 112*v* may be fabricated layer-by-layer in the same process with the conductive features 126, 128 in the corresponding IMD layers 124. Dimension of the sealing lines 110*l*, 112*l* may vary in different IMD layers 124. In some embodiments, the sealing lines 110*l*, 112*l* may have a line width 106*w* in a range between about 0.01 μm and about 6 μm, and a line depth 106*d* in a range between about 0.01 μm and about 6 μm.

The edge interconnect features 108 may be formed in one or more IMD layers 124. Each of the edge interconnect features 108 may be conductive line having an inner end 108*i* and an outer end 108*o*. The inner end 108*i* may be electrically connected to one or more conductive features 128, 126 in the circuit region 104. The outer end 108*o* is embedded in the scribe line 12 outside the seal region 106. In some embodiments, a portion of the edge interconnect features 108 may be dummy connectors to achieve structural uniformity in the integrated circuit die 100. For example, the inner end 108*i* of a portion of the edge interconnect features 108 may be "floating" in the IMD layer 124 without connecting to any other conductive features, such as conductive features 126, 128. If the integrated circuit die 100 is cut out along the scribe line 12, the outer ends 108*o* of the edge interconnect features 108 is exposed on the cutting surface 102.

In some embodiments, the integrated circuit die 100 may be designed to connect with two or more other integrated circuit dies through the edge interconnect features 108. In some embodiments, some of the edge interconnect features 108 may be assigned to provide connections to one of the other integrated circuit dies. For example, a first portion of the edge interconnect features 108*a* along one side of 102 of the integrated circuit die 100*a* may be designated to provide connection with the integrated circuit die 100*b*, and a second portion of the edge interconnect features 108*a* may be designated to provide connection with an integrated circuit die 100*c*, with different circuit designs from the integrated circuit dies 100*a*, 100*b*.

The edge interconnect features 108 extend through the sealing rings 110, 112 through openings 130 which are formed in the sealing ring 110, 112 and the corresponding IMD layer 124. Dielectric material of the IMD layer 124 is disposed between the edge interconnect features 108 and the sealing rings 110, 112 to electrically isolate the edge interconnect features 108 from the sealing rings 110, 112.

The edge interconnect features 108 may be formed in the same process with the conductive features 126, 128 in the corresponding IMD layers 124. In some embodiments, the sealing rings 110, 112 may be formed from the same material as the conductive features 126, 128. For example, the edge interconnect features 108 may be formed from Cu, Al, Co, Ru, Mo, W, and related alloys.

In some embodiments, dimensions of the edge interconnect features 108 may be similar to the conductive features 128 in the same IMD layer 124. In some embodiments, the edge interconnect features 108 may have a line width 108*w* in a range between about 0.01 μm and about 6 μm, and a line depth 108*d* in a range between about 0.01 μm and about 6 μm. A width 130*w* of the openings 130 may be in a range between about 0.03 μm and about 18 μm.

Dimension of the edge interconnect features 108 may vary in different IMD layers 124. Depending on the function and density of the edge interconnect features 108, the edge interconnect features 108 may be formed in the bottom IMD layers 124*x*, the middle IMD layers 124*y*, the top IMD layers 124*z*, and a top metal layer (not shown) above the top IMD layer 124*z*. For example, if the edge interconnect features 108 are used to transfer signals to individual devices in the device layer 120, the density of the edge interconnect features 108 is likely to be relatively high and the width of the edge interconnect features 108 may be relatively small, and the edge interconnect features 108 may be formed in one or more bottom IMD layers 124*x*. If the edge interconnect features 108 are used to provide power supply to the device layer 120, the density of the edge interconnect features 108 is likely to be relatively low and the width of the edge interconnect features 108 may be relatively large, and the edge interconnect features 108 may be formed in one or more top IMD layers 124*z*.

In some embodiments, the scribe lines 12 between the integrated circuit dies 100 may also be filled with suitable materials. A dielectric material may be filled in the scribe lines 12 between the integrated circuit dies 100. The outer end 108*o* of the edge interconnect features 108 are surrounded by the dielectric material in the scribe lines 12, thus, are electrically isolated from one another. In some embodiments, the scribe lines 12 may be filled with the same material as in the IMD layers 124. The scribe lines 12 may be filled and then patterned layer-by-layer in the same process with the conductive features 126, 128 in the corresponding IMD layers 124. In some embodiments, the scribe lines 12 or the dielectric material filled in the scribe lines 12 may include one or more layers of a low dielectric constant (low-K) dielectric material, such as SiOx, SiOxCyHz, $SiO_xC_y$, SiCx, SiNx, or related low-k dielectric material, compounds thereof, composites thereof, combinations thereof, or the like.

FIG. 1E schematically illustrates that each of the edge interconnect features 108*a* of the integrated circuit die 100*a* and the corresponding edge interconnect features 108*b* of the integrated circuit die 100*b* form a continuous conductive line 108*l* across the scribe line 12 between the inter circuit dies 100*a*, 100*b*. The scribe line 12 may include multiple layers of suitable materials formed on the substrate 10 between the seal regions 106*a*, 106*b* of the neighboring integrated circuit dies 102*a*, 102*b*. In some embodiments, the scribe line 12 may be formed layer-by-layer during the fabrication process of the device layer 120*a*, 120*b* and the interconnect structures 122*a*, 122*b*. Layers in the scribe line 12 may include the same materials of the dielectric layers 124 in the interconnect structures 122*a*, 122*b*. In some embodiments, the scribe line 12 may also include one or more dielectric layers between the device layers 120*a*, 120*b*. In other embodiments, the scribe line 12 may be formed separately from the interconnect structures 122*a*, 122*b* and/ or the device layers 120*a*, 120*b* by suitable processes, such as patterning, deposition, and etching. Materials in the scribe line 12 may be different from the dielectric layers 124 in the interconnect structures 122*a*, 122*b*.

A plurality of conductive lines 108*l* are formed across the scribe line 12 between the neighboring integrated circuit dies 100*a*, 100*b*. A portion of the plurality of the conductive lines 108*l* are functional connections with both ends connected to the conductive features 126/128 in the integrated circuit dies 100*a*, 100*a*. In some embodiments, a portion of the conductive lines 108*l* may be dummy connection with at least one end "floating" in the corresponding integrated circuit die 100*a* or 100*b*.

In the embodiment shown in FIGS. 1C, 1D, and 1E, the edge interconnect features 108 are formed in the top IMD layer 124*z*. As discussed above, the edge interconnect features 108 according to the present disclosure may be formed in any suitable IMD layers.

FIG. 1F is an enlarged partial sectional view of the integrated circuit die 100, according to another embodiment, along the line 1C-1C in FIG. 1B. FIG. 1G is an enlarged partial sectional view of the integrated circuit die 100 along the line 1G-1G in FIG. 1F. FIG. 1H is an enlarged partial sectional view of the neighboring integrated circuit die 100*a*, 100*b* along the line 1E-1E in FIG. 1B corresponding to the embodiment shown in FIGS. 1F and 1G. In the embodiment shown in FIGS. 1F, 1G, and 1H, the edge interconnect features 108 are formed in the middle IMD layer 124*y*.

FIG. 1I is an enlarged partial sectional view of the integrated circuit die 100, according to another embodiment, along the line 1C-1C in FIG. 1B. FIG. 1J is an enlarged partial sectional view of the integrated circuit die 100 along the line 1J-1J in FIG. 1I. FIG. 1K is an enlarged partial sectional view of the neighboring integrated circuit die 100*a*, 100*b* along the line 1E-1E in FIG. 1B corresponding to the embodiment shown in FIGS. 1I and 1J. In the embodiment shown in FIGS. 1I, 1J, and 1K, the edge interconnect features 108 are formed in the bottom IMD layer 124*x*.

FIG. 1L is an enlarged partial sectional view of the integrated circuit die 100, according to another embodiment, along the line 1C-1C in FIG. 1B. FIG. 1M is an enlarged partial sectional view of the integrated circuit die 100 along the line 1M-1M in FIG. 1L. FIG. 1N is an enlarged partial sectional view of the neighboring integrated circuit die 100*a*, 100*b* along the line 1E-1E in FIG. 1B corresponding to the embodiment shown in FIGS. 1L and 1M. In the embodiment shown in FIGS. 1L, 1M and 1N, the edge interconnect features 108 are formed in a dielectric material. In some embodiments, the dielectric material may include two or more IMD layers 124. Particularly, in FIGS. 1L, 1M, and 1N, the edge interconnect features 108 are formed in one of the bottom IMD layer 124*x* and in one of the top IMD layer 124*z*. It should be noted that the edge interconnect features 108 may be formed in any combination of IMD layers 124.

Figure 2:
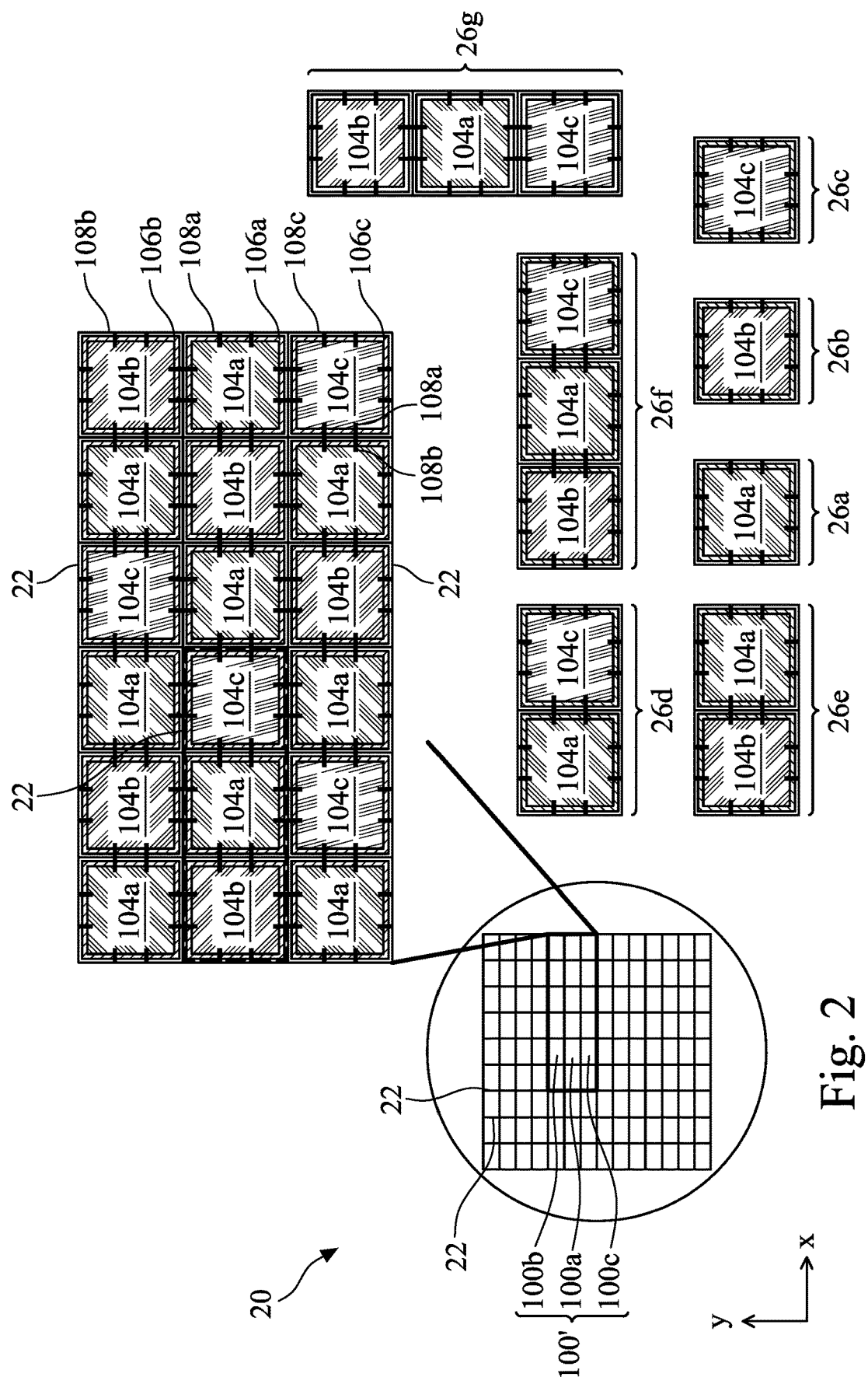
FIGS. 2, 3A-3B, 4, and 5 schematically demonstrate various stages of forming a semiconductor package according to embodiments of the present disclosure.

FIG. 2 is schematic plan views of a substrate 20 having an array of integrated circuit dies 100' formed thereon. The array of integrated circuit dies 100' are separated from each other by two sets of intersecting scribe lines 22. The plurality of integrated circuit dies 100 fabricated in and/or on the substrate 20 include three types of integrated circuit dies 100*a*, 100*b*, 100*c*. Similar to the integrated circuit die 100*a*, 100*b*, the integrated circuit die 100*c* includes edge interconnect features 108*c* extending through seal region 106*c* to the scribe lines 22.

The integrated circuit dies 100*a*, 100*b*, 100*c* may have substantially the same dimension but with different circuit designs to achieve different functions. In some embodiments, the integrated circuit dies 100*a*, 100*b*, 100*c* may be different types of dies to be connected in various combinations.

In the example of FIG. 2, the integrated circuit die 100*a* may be designed to connect with both the integrated circuit die 100*b* and integrated circuit die 100*c*. The integrated circuit dies 100*a*, 100*b*, 100*c* are arranged in a pattern so that each of the integrated circuit die 100*b* is bordered by at least one integrated circuit die 100*a*, and each of the integrated circuit die 100*c* is bordered by at least one integrated circuit die 100*a*. Neighboring integrated circuit dies 100*a*, 100*b* are connected through the edge interconnect features 108*a*, 108*b*. Neighboring integrated circuit dies 100*a*, 100*c* are connected through the edge interconnect features 108*a*, 108*c*.

In some embodiments, the edge interconnect features 108 (108*a*, 108*b*, 108*c*) may be symmetrically arranged across all scribe lines 22 around the integrated circuit die 100 (100*a*, 100*b*, 100*c*) and share the same protocol so that the integrated circuit dies 100*a*, 100*b*, 100*c* can directly connect with one other through the edge interconnect features 108*a*, 108*b*, 108*c*.

In some embodiments, a first portion of the edge interconnected feature 108*a* in the integrated circuit die 100*a* are designated to connect to the edge interconnect features 108*b* in the integrated circuit die 100*b*, and a second portion of the edge interconnected feature 108*a* in the integrated circuit die 100*a* are designated to connect to the edge interconnect features 108*c* in the integrated circuit die 100*c*. The first portion and second portion the edge interconnected features 108*a* may be mutual exclusive or include shared members depending on the circuit design.

Individual integrated circuit dies 100*a*, 100*b*, 100*c* may be tested before cutting. The integrated circuit dies 100*a*, 100*b*, 100*c* may be cut into various die combinations, such as die combinations 26*a*, 26*b*, 26*c*, 26*d*, 26*e*, 26*f*, 26*g* for packaging, thus lowering cost of production. For the die combinations 26*a*, 26*b*, 26*c* which include single integrated circuit dies 100*a*, 100*b*, 100*c* conductive features may be formed from the exposed edge interconnect features 108 to connect with other integrated circuit dies without going through an interposer. The die combinations 16*d*, 16*e*, which includes the two integrated circuit dies 100*a*/100*c* or 100*a*/100*b*, may be directly packaged as connected components. The die combinations 26*f*, 26*g*, which includes the three integrated circuit dies 100*a*, 100*b*, 100*c* of in different arrangement may be directly packaged as connected components.

FIGS. 3A-3D, 4A-4D, 5A-5B, 6, and 7 schematically demonstrate various stages of forming a semiconductor package 300 according to embodiments of the present disclosure. The semiconductor package 300 includes a directly connected die combination with two or more integrated circuit dies formed on the same substrate and connected through edge interconnect features according to the present disclosure.

Figure 3A:
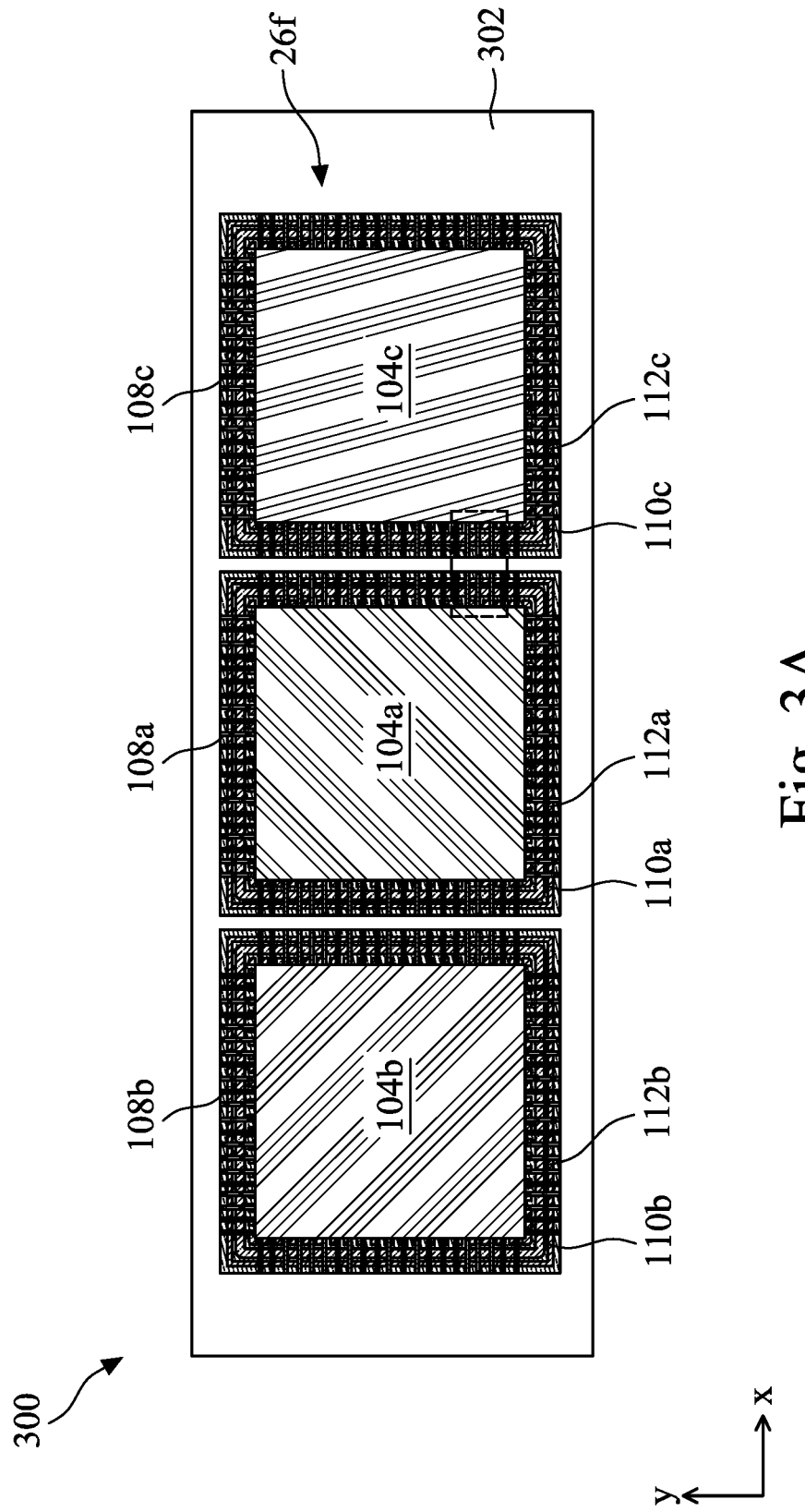
Figure 3B:
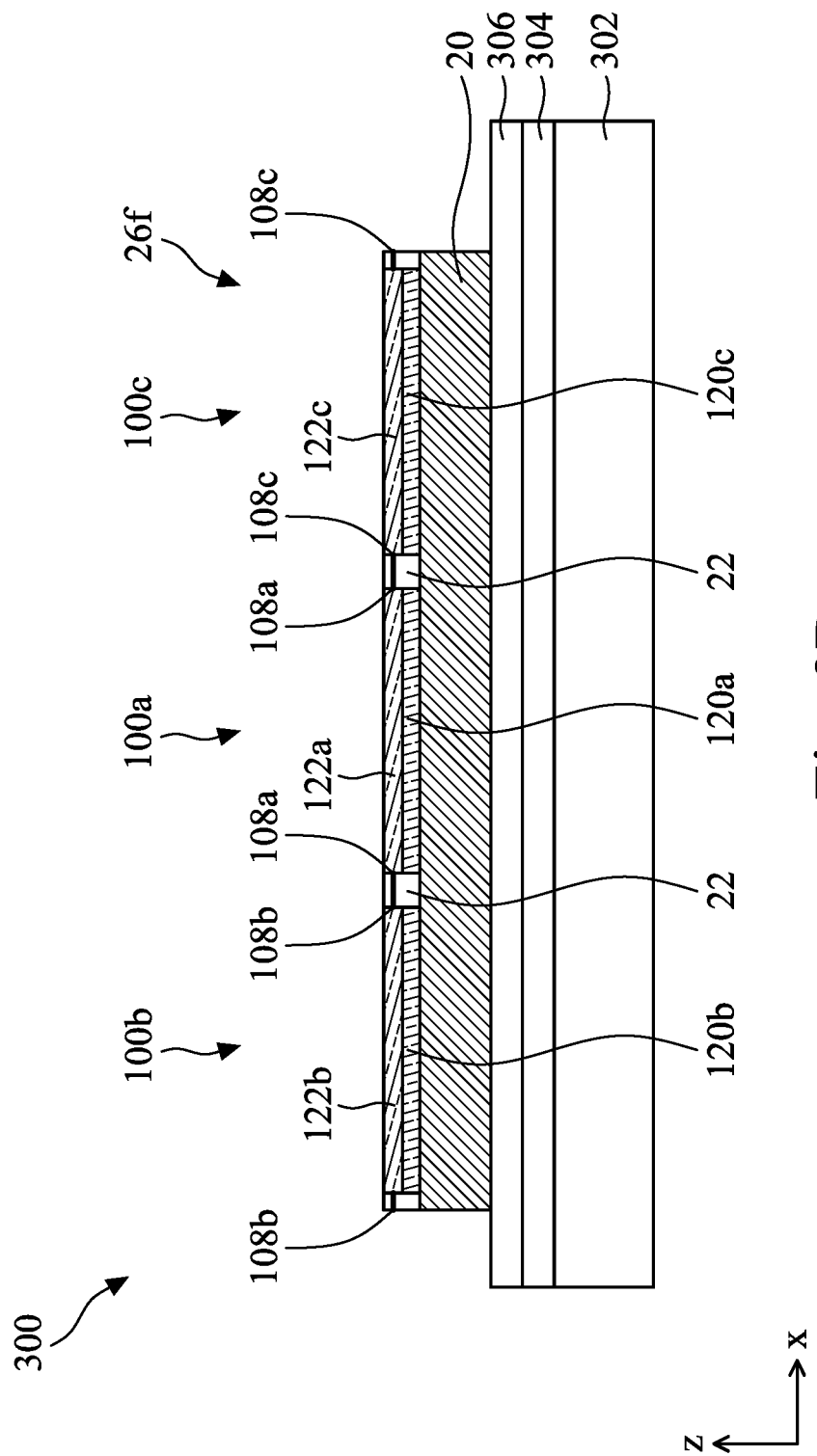

FIG. 3A is a schematic plan view of the semiconductor package 300. FIG. 3B is a schematic cross-sectional view of the semiconductor package 300. In FIG. 3A, the semiconductor package 300 includes the die combination 26f, which includes three integrated circuit dies 100b, 100a, 100c formed in and/or the substrate 20 and connected by the edge interconnect features 108a, 108b, 108c formed in the scribe line 22.

As discussed in FIG. 2, the die combination 26f may be fabricated by fabricating the array of integrated circuit dies 100 including the integrated circuit dies 100b, 100a, 100c in a suitable pattern, testing individual integrated circuit dies 100a, 100b, 100c, and then cutting out a die combination including good and connected integrated circuit dies 100b, 100a, 100c. The die combination 26f is only an example. Other die combinations, such as the die combination 26g may be used in place of the die combination 26g to perform the same function. Die combinations with different sets of integrated circuit dies may be used to fabricate semiconductor packages for other functions.

In some embodiments, the integrated circuit dies 100a, 100b, 100c may include any suitable circuit designs that may be fabricated on the same substrate. For example, each of the integrated circuit dies 100a, 100b, 100c may be a system on a chip (SOC) or a system on integrated circuit (SOIC) die; a memory die, such as a static random-access memory (SRAM) die, a dynamic random-access memory (DRAM) die, a high bandwidth memory (HBM) die, or the like; a passive device die, such as a multilayer ceramic chip (MLCC) capacitor die, an integrated passive device (IPD) die, an integrated voltage regulator (IVR) die, the like, or a combination thereof; a logic die; an analog die; a microelectromechanical system (MEMS) die, a radio frequency (RF) die, or a combination thereof. In some embodiments, the integrated circuit dies 100a, 100b, 100c may be interconnected through edge interconnect features and intended to function as a die combination without cutting away from one another when connected integrated circuit dies 100a, 100b, 100c all pass test. In some embodiments, when an integrated circuit die 100a, 100b, 100c on a substrate fail the test, the failed integrated circuit die 100a, 100b, 100c is cut out leaving neighboring integrated circuit dies 100a, 100b, 100c to form a die combination with other dies. In some embodiments, the integrated circuit dies 100a, 100b, 100c may be three different SOCs As shown in FIG. 3A, each of the integrated circuit die 100a, 100b, 100c includes the circuit region 104a, 104b, 104c surrounded by the one or more sealing rings 110a/112a, 110b/112b, 110c/112a. The edge interconnect features 108a, 108b, 108c extend from the corresponding circuit region 104a, 104b, 104c through the regions of the sealing rings 110a/112a, 110b/112b, 110c/112c into the scribe lines 22.

The scribe line 22 may include multiple layers of suitable materials formed on the substrate 20 surrounding the sealing rings 110a/112a, 110b/112b, 110c/112c of the integrated circuit dies 102a, 102b, 106c. In some embodiments, the scribe line 22 may be formed layer-by-layer during the fabrication process of the device layers 120a, 120b, 120c and the interconnect structures 122a, 122b, 122c. Layers in the scribe line 22 may include the same materials of the dielectric layers in the interconnect structures 122a, 122b, 122c. In some embodiments, the scribe line 22 may also include one or more dielectric layers between the device layers 120a, 120b, 120c. In other embodiments, the scribe line 22 may be formed separately from the interconnect structures 122a, 122b, 122c and/or the device layers 120a, 120b, 120c by suitable processes, such as patterning, deposition, and etching. Materials in the scribe line 22 may be different from the dielectric layers in the interconnect structures 122a, 122b, 122c.

As shown in FIG. 3B, the edge interconnect features 108b, 108a in the scribe line 22 between the integrated circuit dies 100b, 100a form continuous conductive lines to provide direct electric connections therebetween, and the edge interconnect features 108a, 108c in the scribe line 22 between the integrated circuit dies 100a, 100c form continuous conductive lines to provide direct electric connections therebetween.

As shown in FIGS. 3A and 3B, the die combination 26f is attached to a carrier substrate 302. In some embodiments, an adhesive layer 304 is formed on the carrier substrate 302, and a die attach film 306 is formed on the adhesive layer 304. The die combination 26f is attached on the die attach film 306. The carrier substrate 302 may be a glass carrier substrate, a ceramic carrier substrate, or the like. In some embodiments, multiple semiconductor packages can be formed on the carrier substrate 302 simultaneously.

The adhesive layer 304 is placed on the carrier substrate 302 to assist in the adherence of overlying structures, for example, the die combination 26f. In some embodiments, the adhesive layer 304 may comprise a light to heat conversion (LTHC) material or an ultra-violet glue, although other types of adhesives, such as pressure sensitive adhesives, radiation curable adhesives, epoxies, combinations of these, or the like, may also be used. The adhesive layer 304 may be placed onto the carrier substrate 302 in a semi-liquid or gel form, which is readily deformable under pressure. In other embodiments, the adhesive layer 304 may be an ultra-violet (UV) glue, which loses its adhesive property when exposed to UV lights.

The die attach film 306 may be placed on the adhesive layer 304 to assist in the attachment of the die combination 26f to the adhesive layer 304. In some embodiments, the first die attach film 306 may be an epoxy resin, a phenol resin, acrylic rubber, silica filler, or a combination thereof, and is applied using a lamination technique. The die attach film 306 may be dispensed as a liquid and cured, may be a laminate film laminated onto the carrier substrate 302, or may be the like. In some embodiments, the top surface of the die attach film 306 may be leveled and may have a high degree of coplanarity. However, any other suitable alternative material and method of formation may alternatively be utilized.

The die combination 26f may be placed onto the die attach film 306. The die combination 26f may be placed using, e.g., a pick and place process, in a face-up orientation. However, any suitable method of placing the die combination 26f onto the die attach film 306 may also be utilized.

Figure 4:
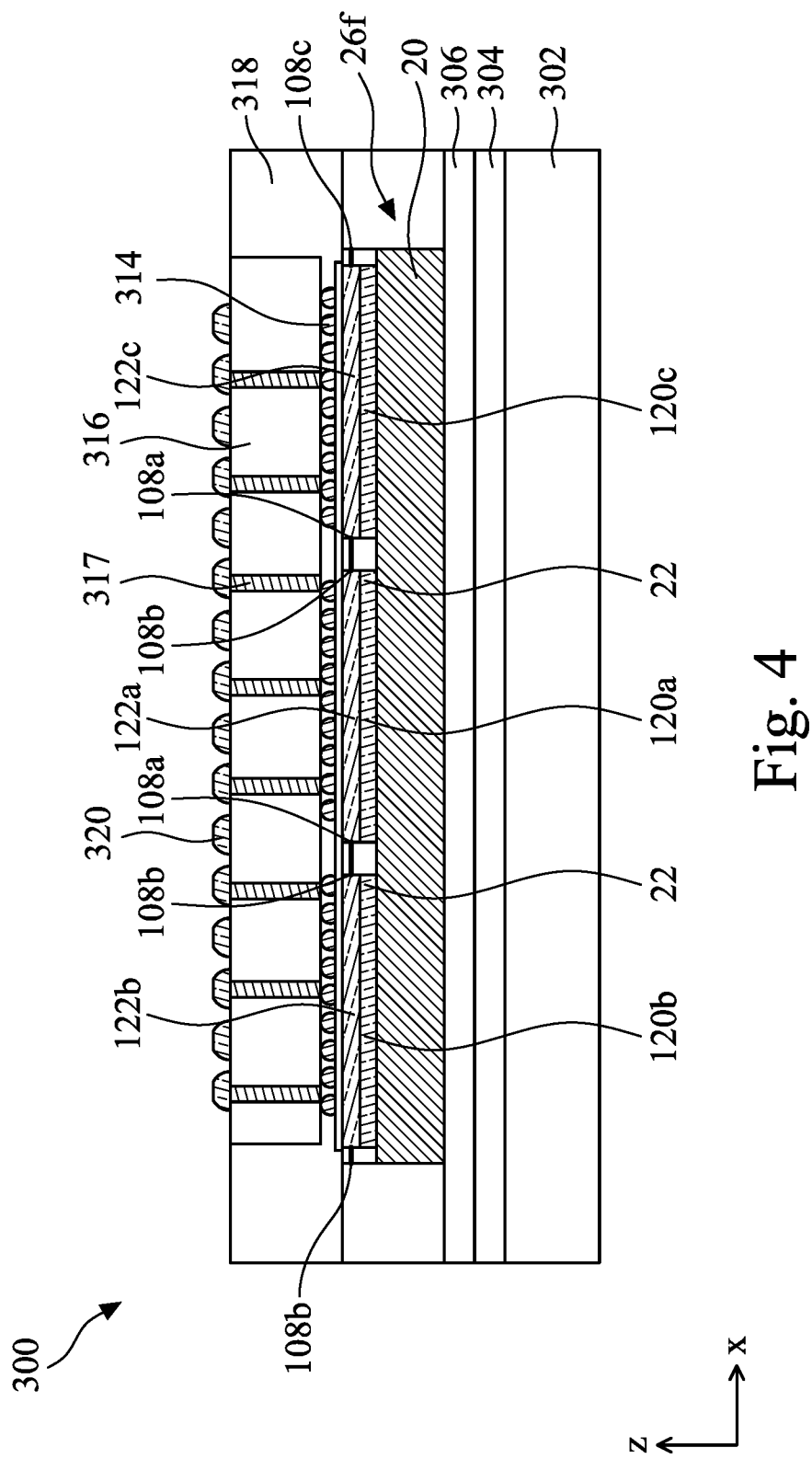

After the die combination 26f is attached to the carrier substrate 302, an encapsulant layer 312 is formed over various components, including the die combination 26f, on the carrier substrate 302, as shown in FIG. 4. FIG. 4 is a schematic cross-sectional view of the semiconductor package 300.

The encapsulant layer 312 may be a molding compound, epoxy, or the like, and may be applied by compression molding, lamination, transfer molding, or the like. The encapsulant layer 312 may be formed over the carrier substrate 302 such that cutting surfaces of the die combination 26f are buried or covered. The encapsulant layer 312 may then be cured.

In some embodiments, the encapsulant layer 312 may undergo a grinding process to expose conductive features on the integrated circuit dies 100a, 100b, 100c so that external contacts 314 may be formed. The external contacts 314 may be formed on the integrated circuit dies 100a, 100b, 100c, for example, by a bumping process. The external contacts 314 may be, e.g., conductive pillars such as a copper pillars or copper posts. In some embodiments, the external contacts 314 may be solder bumps, copper bumps, or other suitable external contacts that may be made to provide electrical connection from the integrated circuit dies 100a, 100b, 100c to other external devices. All such external contacts are fully intended to be included within the scope of the embodiments. As the edge interconnect features 108a, 108b, 108c provide internal connections between or among the integrated circuit dies 100a, 100b, 100c, the external contacts 314 may be used to provide external connections to the integrated circuit dies 100a, 100b, 100c.

In some embodiments, an optional interposer substrate 316 may be attached to the external contacts 314. The interposer substrate 316 may include various embedded interconnections, which may provide routes from the external contacts 314 to external circuits, such as a printed circuit board. In other embodiments, the external contacts 314 may be subsequently connected to a printed circuit board.

An encapsulant layer 318 may then be formed over the interposer substrate 316. The encapsulant layer 318 may be a molding compound, epoxy, or the like, and may be applied by compression molding, lamination, transfer molding, or the like. The encapsulant layer 318 may be formed over the interposer substrate 316 such that the external contacts 314 are buried or covered. The encapsulant layer 318 may then be cured. In some embodiments, the encapsulant layer 318 and the encapsulant layer 312 may be formed from the same material.

In some embodiments, the encapsulant layer 318 may undergo a grinding process to expose conductive features on the interposer substrate 316. External connectors 320 are then formed on the interposer substrate 316. The external connectors 320 may be used to connect the semiconductor package 300 to a printed wiring board or printed circuit board (PCB) to form an electronic assembly. In some embodiments, through substrate vias or TSVs 317 extend vertically through the interposer substrate 316 and electrically connect the external connectors 320 and the external contacts 314. In some embodiments, the TSVs 317 may be through silicon vias where a silicon substrate material is used. TSVs 317 may be made of any suitable conductive material commonly used in the art for such vias, including without limitation tungsten, copper, nickel, or alloys thereof. In some representative embodiments, TSVs 317 may have a representative diameter, without limitation, of about 5 microns to about 12 microns depending on the design requirement and process used to form the TSVs 317.

Figure 5:
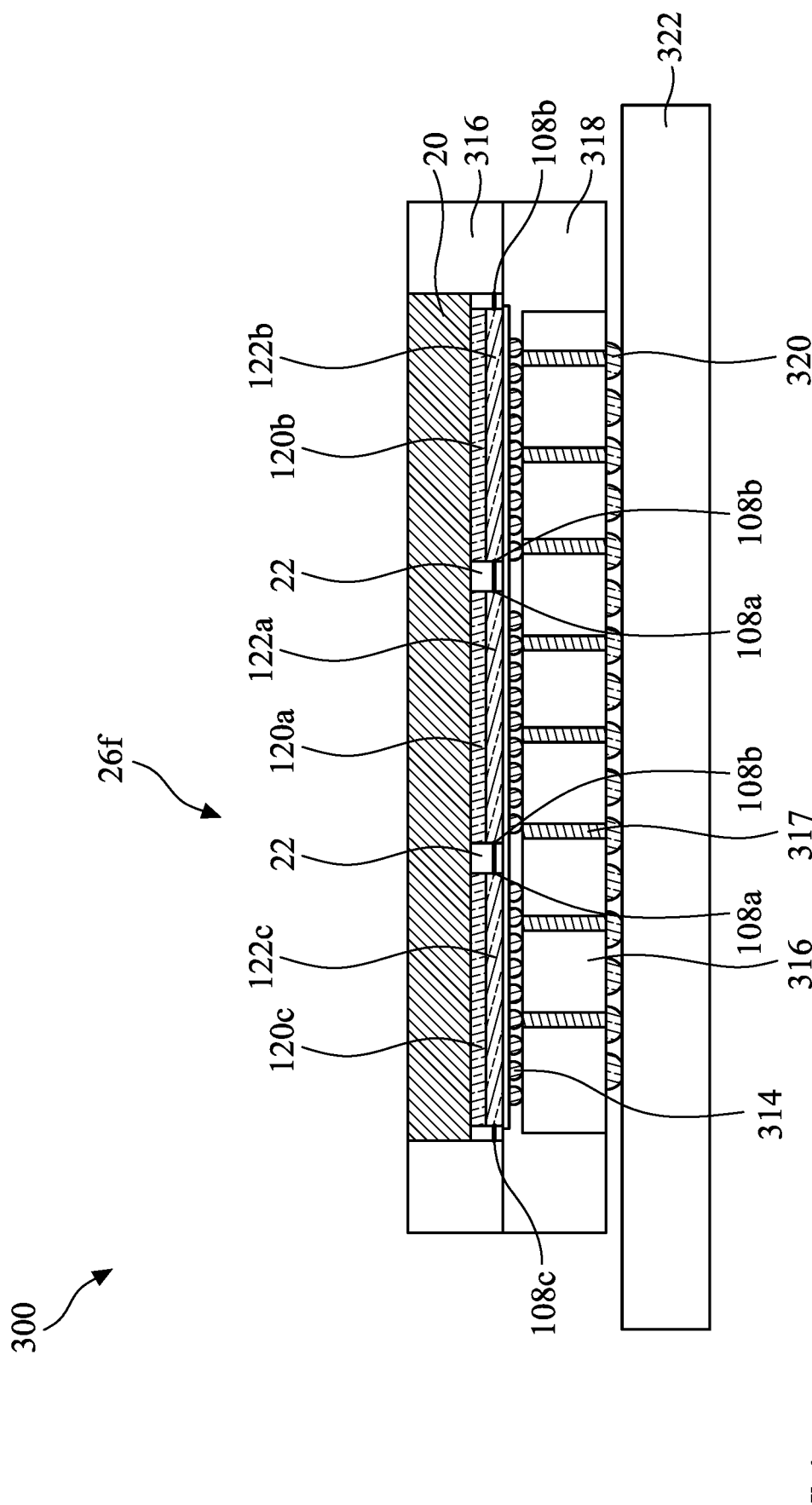

FIG. 5 schematic cross-sectional view of the semiconductor package 300 attached to a PCB 322, with the carrier substrate 302 along with the adhesive layer 304 and the die attach film 306 removed. The PCB 322 may be part of an electronic assembly can be part of an electronic system such as computers, wireless communication devices, computer-related peripherals, entertainment devices, or the like.

Even though three integrated circuit dies 100a, 100b, 100c are shown in the semiconductor package 300, less or more integrated circuit dies with edge interconnect features may be packaged together according to circuit design.

Embodiments of the present disclosure provide an integrated circuit die with edge interconnect features extending from one or more IMD layers across a scribe line to another integrated circuit die. The edge interconnect features of different integrated circuit dies provide direct connection between the integrated circuit dies. The direct connection between different integrated circuit dies reduces interposer layers, redistribution process, and bumping processes in multi-die integration, thus, reducing cost of manufacturing. The edge interconnect features also enable power to be directly transferred therethrough, instead of going through interposer substrates, or PCBs, thus achieve higher performance. The edge interconnect features, connected to one or more IMD layers, also enables higher routing density than through an interposer. The edge interconnect features design may be easily adopted from one integrated circuit die to another, thus, provide high feasibility and flexibility for designers.

Some embodiments of the present provide a semiconductor device, comprising a first integrated circuit die comprising a first sealing ring encircling a first circuit region, a second integrated circuit die comprising a second sealing ring encircling a second circuit region, a dielectric layer formed between the first sealing ring and the second sealing ring, and a conductive line extending from the first circuit region to the second circuit region through the first sealing ring, the dielectric layer, and the second sealing ring.

Some embodiments of the present disclosure provide an integrated circuit die. The integrated circuit die includes a device layer comprising one or more semiconductor devices, an interconnect structure formed on the device layer, wherein the interconnect structure comprises a dielectric layer, a sealing ring formed in the dielectric layer encircling a circuit region within the dielectric layer, and one or more conductive features embedded in the circuit region of the dielectric layer, wherein the one or more conductive features are connected to one or more semiconductor devices in the device layer, and a plurality of edge interconnect features formed in the dielectric layer, wherein the plurality of edge interconnect features extending outwards from the circuit region through the sealing ring.

Some embodiments of the present disclosure provide a method for forming a semiconductor device. The method includes forming a first integrated circuit die having a first edge interconnect feature, and a second integrated circuit die having a second edge interconnect feature on a substrate, wherein a scribe line is formed between the first and second integrated circuit dies, and the first edge interconnect feature connected to the second edge interconnect feature in the scribe line; and attaching the first and second integrated circuit dies to a printed circuit board with the first and second circuit dies remaining connected to each other the scribe line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:

forming a first integrated circuit die having a plurality of first edge interconnect features, and a second integrated circuit die having a plurality of second edge interconnect features on a substrate, wherein a scribe line is formed between the first and second integrated circuit dies, and the plurality of first edge interconnect features are connected to the plurality of second edge interconnect features in the scribe line, wherein a portion of the first interconnect features and a portion of second interconnect features are dummy connectors floating in the first integrated circuit die and the second integrated circuit die, wherein forming the first and second integrated circuit dies comprises:

forming a device layer including one or more semiconductor devices in and on the substrate; and forming an interconnect structure over the device layer comprising:

sequentially forming a plurality of IMD layers over the device layer, wherein each of the plurality of IMD layers comprises:

a circuit region having conductive lines and conductive vias in connection with the semiconductor devices in the device layer; and a seal region around an outer perimeter of the circuit region, wherein the seal region includes a sealing ring;

wherein the edge interconnect features are embedded in a first IMD layer of the plurality of IMD layers, and the edge interconnect features extend from the circuit region through the seal region; and attaching the first and second integrated circuit dies to a printed circuit board with the first and second circuit dies remaining connected to each other at the scribe line, wherein in each of the plurality of IMD layer, the sealing ring comprises: a continuous sealing line and a plurality of sealing vias stacked over the continuous sealing line, wherein in the first IMD layer, continuous sealing line includes a plurality of openings, and the interconnect features extend through the plurality of openings.

2. The method of claim 1, further comprising, prior to attached the first and second circuit dies to the printed circuit board:

attaching an interposer to the first and second integrated circuit dies through plurality of external contacts.

3. The method of claim 1, wherein forming a first integrated circuit die having a first edge interconnect feature comprises forming an array of integrated circuit dies on the substrate, wherein the array of integrated circuit dies includes a plurality of first integrated circuit dies and a plurality of second integrated circuit dies arranged in a pattern so that each first integrated circuit die shares scribe lines with two or more second integrated circuit dies.

4. The method of claim 3, further comprising:

testing the array of integrated circuit dies after forming the first and second edge interconnect features; and cutting a die combination including one first integrated circuit die and one second integrated circuit die sharing a scribe line.

5. The method of claim 1, wherein the corresponding first and second interconnect features form a monolithic conductive line.

6. The method of claim 1, wherein the sealing ring further comprises a second continuous sealing line concentrically disposed outside the continuous sealing line, and a plurality of second sealing vias stacked over the second continuous sealing line.

7. A method for forming a semiconductor device, comprising:

providing a substrate; and forming a first integrated circuit die comprising a first sealing ring encircling a first circuit region and a second integrated circuit die comprising a second sealing ring encircling a second circuit region on the substrate, wherein the first sealing ring and second sealing ring comprise physically connected conductive components disposed around the first circuit region and the second circuit region respectively, first and second openings formed through the first sealing ring, and third and fourth openings formed through the second sealing ring, wherein a dielectric layer is formed between the first sealing ring and the second sealing ring, a conductive line is embedded in the dielectric layer and extending through the first opening in the first sealing ring to the third opening in the second sealing ring, a dummy connector is embedded in the dielectric layer and extending through the second opening in the first sealing ring to the forth opening in the second sealing ring, wherein the dummy connector has a first end floating in the first circuit die and a second end floating in the second circuit die.

8. The method of claim 7, wherein forming the first integrated circuit die comprises:

forming a first interconnect structure, wherein the conductive line is in connection with the first interconnect structure.

9. The method of claim 8, wherein forming the first integrated circuit die further comprises forming a plurality of external contacts on the first interconnect structure.

10. The method of claim 9, further comprising attaching an interposer substrate to the plurality of external contacts of the first integrated circuit die.

11. The method of claim 8, wherein forming the first interconnect structure comprises:

forming an IMD (inter metal dielectric) layer having a conductive feature embedded therein, wherein the conductive line is in connection with the conductive feature.

12. The method of claim 11, wherein the first sealing ring includes sections of the conductive lines embedded in the IMD layer having the first and second openings formed therethrough, and the conductive line extends between sections of the first sealing ring.

13. A method, comprising:

forming a device layer comprising one or more semiconductor devices; and forming an interconnect structure on the device layer, wherein the interconnect structure comprises:

a dielectric layer including a first circuit region and a first seal region around an outer perimeter of the first circuit region, and a second circuit region and a second seal region around an outer perimeter of the second circuit region;

a first sealing ring formed in the first seal region of the dielectric layer, wherein the first sealing ring comprises a first conductive ring and second conductive ring concentrically disposed in the first seal region of the dielectric layer;

a second sealing ring formed in the second seal region of the dielectric layer;

one or more conductive features embedded in the first circuit region of the dielectric layer, wherein the one or more conductive features are connected to one or more semiconductor devices in the device layer; and a plurality of first edge interconnect features formed in the dielectric layer, wherein the plurality of edge interconnect features extending outwards from the first circuit region through the first sealing ring, wherein each of the first plurality of edge interconnect features includes an inner end formed in the first circuit region and an outer end in a scribe line region outside the first sealing ring, and a continuously conductive line across the first circuit region and the first seal region of the dielectric layer and connecting the inner end and the outer end, wherein a portion of the plurality of edge interconnect features are dummy connectors with the inner end floating in the circuit region;

a plurality of second edge interconnect features extending outwards from the second circuit region through the second sealing ring, wherein a portion of the plurality of second edge interconnect features are connected to a portion of the plurality of first edge interconnect features in the dielectric layer.

14. The method of claim 13, wherein at least a portion of the plurality of edge interconnect features are electrically connected to the one or more conductive features.

15. The method of claim 14, wherein the sealing ring is a rectangle ring, and the plurality of edge interconnect features are symmetrically distributed along four sides of the rectangle ring.

16. The method of claim 15, wherein a portion of the dielectric layer is formed outside the sealing ring, and the plurality of edge interconnect features extend across the sealing ring.

17. The method of claim 13, wherein the plurality of edge interconnect features extend through sections of the sealing ring.

18. The method of claim 13, wherein the first sealing ring comprises physically connected conductive components disposed around the first circuit region, a plurality of first openings are formed through the first sealing ring, and the plurality of first edge interconnect features are formed through the first openings.

19. The method of claim 18, wherein the second sealing ring comprises physically connected conductive components disposed around the second circuit region, a plurality of second openings are formed through the second sealing ring, and the plurality of second edge interconnect features are formed through the second openings.

20. The method of claim 18, wherein the first conductive ring comprises a continuous sealing line and a plurality of sealing vias stacked over the continuous sealing line, wherein the plurality of first openings are formed through a continuous sealing line.

* * * * *